(12) United States Patent
Yamala et al.

(10) Patent No.: US 12,387,598 B2
(45) Date of Patent: Aug. 12, 2025

(54) AUTOMATIC REAL TIME INFORMATION TO VEHICULAR OCCUPANTS

(71) Applicant: International Business Machines Corporation, Armonk, NY (US)

(72) Inventors: Kamal Kiran Trood Yamala, Visakhapatnam (IN); Venkata Vara Prasad Karri, Visakhapatnam (IN); Divya Mantha, Vizag (IN)

(73) Assignee: International Business Machines Corporation, Armonk, NY (US)

( * ) Notice: Subject to any disclaimer, the term of this patent is extended or adjusted under 35 U.S.C. 154(b) by 757 days.

(21) Appl. No.: 17/455,216

(22) Filed: Nov. 16, 2021

(65) Prior Publication Data
US 2023/0154323 A1    May 18, 2023

(51) Int. Cl.
G08G 1/0967    (2006.01)
G01C 21/34    (2006.01)
G05B 13/02    (2006.01)
G06F 30/20    (2020.01)
G07C 5/02    (2006.01)
(Continued)

(52) U.S. Cl.
CPC ... G08G 1/096766 (2013.01); G01C 21/3484 (2013.01); G05B 13/0265 (2013.01); G06F 30/20 (2020.01); G07C 5/02 (2013.01); G08G 1/0112 (2013.01); G08G 1/0141 (2013.01); G08G 1/096775 (2013.01); B60W 2040/0809 (2013.01); B60W 2540/043 (2020.02)

(58) Field of Classification Search
CPC ......... G08G 1/096766; G08G 1/0112; G08G 1/0141; G08G 1/096775; G01C 21/3484; G05B 13/0265; G06F 30/20; G07C 5/02
See application file for complete search history.

(56) References Cited

U.S. PATENT DOCUMENTS 8,825,264 B2    9/2014  Montemerlo
2012/0293532 A1*    11/2012  Armbrust ............... B60K 35/22
345/589

(Continued)

FOREIGN PATENT DOCUMENTS

CN    112255370    *    1/2021    ......... H05K 7/20136
DE    102004006910 A1    8/2005
(Continued)

OTHER PUBLICATIONS

CN-112255370-A translation (Year: 2021).*
(Continued)

*Primary Examiner* — Joan T Goodbody
(74) *Attorney, Agent, or Firm* — Elliot J. Shine

(57) ABSTRACT

A system, program product, and method for automatic collection, generation, and presentation of real time information to vehicular occupants are presented. The method includes determining a first driver profile for a first driver of a first vehicle. The method also includes determining, subject to the first driver profile determination, a color assignment for the first driver. The color assignment is at least partially indicative of the driver profile and the color assignment is at least a portion of a representation of the first driver. The method further includes communicating the color assignment to one or more of one or more potential occupants of the first vehicle and one or more occupants of the first vehicle.

20 Claims, 10 Drawing Sheets

(51) Int. Cl.
  *G08G 1/01* (2006.01)
  *B60W 40/08* (2012.01)

(56) References Cited

U.S. PATENT DOCUMENTS

| 2015/0186714 | A1 | 7/2015 | Ren |
| 2018/0181359 | A1* | 6/2018 | Monroe ............... G06F 3/0488 |
| 2019/0017839 | A1* | 1/2019 | Eyler ............... G01C 21/3647 |
| 2019/0143994 | A1 | 5/2019 | Chen |
| 2020/0094821 | A1 | 3/2020 | Kim |

FOREIGN PATENT DOCUMENTS

| EP | 2958783 B1 | 11/2016 |
| IN | 201911023674 | 5/2019 |
| JP | 2017173939 A | 9/2017 |

OTHER PUBLICATIONS

Anonymous, "Cognitive Based Smart Configurable Security System for Automobiles depending on the Context," IP.com, Disclosure No. IPCOM000255070D, Aug. 29, 2018, 5 pages. <https://priorart.ip.com/IPCOM/000255070>.

Anonymous, "System and method to detect driving records for avoidance," IP.com, Disclosure No. IPCOM000239696D, Nov. 25, 2014, 2 pages. <https://priorart.ip.com/IPCOM/000239696>.

Anonymous, "User Based Road Safety Prediction Visualizer," IP.com, Disclosure No. IPCOM000262026D, Apr. 26, 2020, 5 pages. <https://priorart.ip.com/IPCOM/000262026>.

Coni et al., "On-Board Comfort of Different Age Passengers and Bus-Lane Characteristics," Computational Science and Its Applications (ICCSA 2020), Jul. 1-4, 2020, pp. 658-672. <https://www.ncbi.nlm.nih.gov/pmc/articles/PMC7974194/>.

Junior et al., "Driver behavior profiling: An investigation with different smartphone sensors and machine learning," PLoS ONE 12(4): e0174959, Apr. 10, 2017, 9 pages. <https://journals.plos.org/plosone/article?id=10.1371/journal.pone.0174959>.

Khedkar et al., "Driver Evaluation System Using Mobile Phone and OBD-II System," International Journal of Computer Science and Information Technologies (IJCSIT), vol. 6 (3), 2015, pp. 3728-3745. <http://citeseerx.ist.psu.edu/viewdoc/download?doi=10.1.1.736.4633&rep=rep1&type=pdf>.

Mell et al., "The NIST Definition of Cloud Computing," Recommendations of the National Institute of Standards and Technology, U.S. Department of Commerce, Special Publication 800-145, Sep. 2011, 7 pages.

Telpaz et al. "An Approach for Measurement of Passenger Comfort: Real-Time Classification based on In-Cabin and Exterior Data," 2018 21st International Conference on Intelligent Transportation Systems (ITSC), Nov. 4-7, 2018, pp. 223-229 .<https://www.researchgate.net/publication/329363650>.

* cited by examiner

AUTOMATIC REAL TIME INFORMATION TO VEHICULAR OCCUPANTS

BACKGROUND

The present disclosure relates to automatic collection, generation, and presentation of real time information to vehicular occupants, and, more specifically, to automatically and dynamically provide recommendations and insights to the passengers and operator of a vehicle while travelling therein.

Many known vehicular routes experience heavy traffic conditions, varying road quality conditions, and a broad spectrum of vehicle operators and passengers with respect to experience and temperament.

SUMMARY

A system, computer program product, and method are provided for automatic collection, generation, and presentation of real time information to vehicular occupants.

In one aspect, a computer system is provided for provided for automatic collection, generation, and presentation of real time information to vehicular occupants. The system includes one or more processing devices and one or more memory devices communicatively and operably coupled to the one or more processing devices. The system also includes a transport information tool communicatively and operably coupled to the one or more processing devices and the one or more memory devices, The transport information tool includes a vehicle occupant profiling engine configured to determine a first driver profile for a first driver of a first vehicle. The transport information tool also includes a modeling engine configured to determine, subject to the first driver profile determination, a color assignment for the first driver. The color assignment is at least partially indicative of the driver profile and the color assignment is at least a portion of a representation of the first driver. The computer system also includes a computer network configured to communicate the color assignment to one or more of one or more potential occupants of the first vehicle and one or more occupants of the first vehicle.

In another aspect, a computer program product embodied on at least one computer readable storage medium having computer executable instructions for automatic collection, generation, and presentation of real time information to vehicular occupants that when executed cause one or more computing devices to automatically and dynamically provide recommendations and insights to the passengers and operator of a vehicle while travelling therein. The computer executable instructions when executed also cause the one or more computing devices to determine a first driver profile for a first driver of a first vehicle. The computer executable instructions when executed also cause the one or more computing devices to determine, subject to the first driver profile determination, a color assignment for the first driver. The color assignment is at least partially indicative of the driver profile and the color assignment is at least a portion of a representation of the first driver. The computer executable instructions when executed further cause the one or more computing devices to communicate the color assignment to one or more of one or more potential occupants of the first vehicle and one or more occupants of the first vehicle.

In yet another aspect, a computer-implemented method is provided for automatically collecting, generating, and presenting real time information to vehicular occupants. The method includes determining a first driver profile for a first driver of a first vehicle. The method also includes determining, subject to the first driver profile determination, a color assignment for the first driver. The color assignment is at least partially indicative of the driver profile and the color assignment is at least a portion of a representation of the first driver. The method further includes communicating the color assignment to one or more of one or more potential occupants of the first vehicle and one or more occupants of the first vehicle.

The present Summary is not intended to illustrate each aspect of, every implementation of, and/or every embodiment of the present disclosure. These and other features and advantages will become apparent from the following detailed description of the present embodiment(s), taken in conjunction with the accompanying drawings.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are illustrative of certain embodiments and do not limit the disclosure.

Figure 1A:
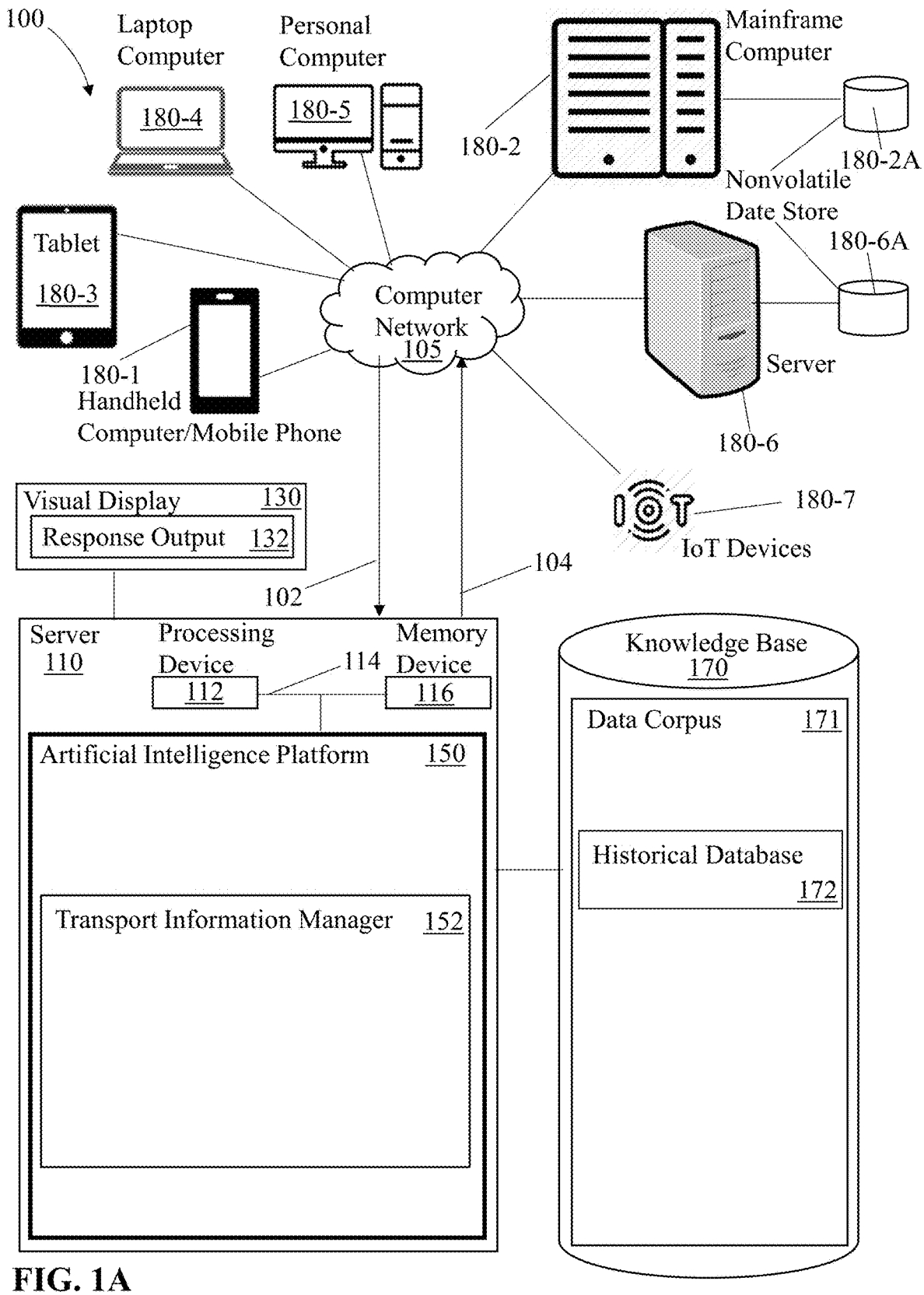
FIG. 1A is a block schematic diagram illustrating a computer system including an artificial intelligence platform suitable for leveraging a trained cognitive system to facilitate automatic collection, generation, and presentation of real time information to vehicular occupants, in accordance with some embodiments of the present disclosure.

While the present disclosure is amenable to various modifications and alternative forms, specifics thereof have been shown by way of example in the drawings and will be described in detail. It should be understood, however, that the intention is not to limit the present disclosure to the particular embodiments described. On the contrary, the intention is to cover all modifications, equivalents, and alternatives falling within the spirit and scope of the present disclosure.

DETAILED DESCRIPTION

Aspects of the present disclosure relate to automatic collection, generation, and presentation of real time information to vehicular occupants. While the present disclosure is not necessarily limited to such applications, various aspects of the disclosure may be appreciated through a discussion of various examples using this context.

It will be readily understood that the components of the present embodiments, as generally described and illustrated in the Figures herein, may be arranged and designed in a wide variety of different configurations. Thus, the following details description of the embodiments of the apparatus, system, method, and computer program product of the present embodiments, as presented in the Figures, is not intended to limit the scope of the embodiments, as claimed, but is merely representative of selected embodiments.

Reference throughout this specification to "a select embodiment," "at least one embodiment," "one embodiment," "another embodiment," "other embodiments," or "an embodiment" and similar language means that a particular feature, structure, or characteristic described in connection with the embodiment is included in at least one embodiment. Thus, appearances of the phrases "a select embodiment," "at least one embodiment," "in one embodiment," "another embodiment," "other embodiments," or "an embodiment" in various places throughout this specification are not necessarily referring to the same embodiment.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

Many known vehicular routes experience heavy traffic conditions, varying road quality conditions, and a broad spectrum of vehicle operators and passengers with respect to experience and temperament. In addition, many areas of the world typically suffer frequent or chronic traffic congestion, thereby increasing the burden on, and accelerating the wear and tear of, the respective thoroughfares. Moreover, the burden associated with vehicular travel increases the psychological stress of the occupants, i.e., the drivers and their passengers. Therefore, the psychological disposition of the drivers and passengers play a role in the overall travel environment on the thoroughfares. However, while engaged in traffic navigation, it is typically difficult to ascertain the real time disposition of nearby drivers; therefore, it is equally difficult to anticipate the behaviors of the respective drivers. Furthermore, for those passengers that use cabs and other travel services, the potential passengers are not always knowledgeable of the driving history of the drivers for the routes and conditions that will be traversed.

A system, computer program product, and method are disclosed and described herein for automatic collection, generation, and presentation of real time information to vehicular occupants, and, more specifically, to automatically and dynamically provide recommendations and insights to the passengers and operator of a vehicle while travelling therein. The terms "operator," "operators," "driver," and "drivers" are used interchangeably herein. The system, computer program product, and method disclosed herein integrate artificial intelligence, machine learning features, simulation, augmented reality, and virtual reality. The system automatically considers various attributes such as the dynamic behavior of a vehicle operator based on the respective operator's driving profile, as well as the additional inputs from the respective passenger profiles (discussed further below). Such operator profiles include the relationships with the passengers (at least partially established through the respective passenger profiles), adherence and deviations from established routes, adherence to established laws, including speed limits, vehicular accident history, and present speed of the respective vehicle. In addition, the operator profile includes context such as environmental conditions such as weather (gloomy, cloudy, rainy, hot and humid, etc.) and the road conditions. Passenger profiles include the attributes of the passengers boarded (preferred driver behaviors, required level of assistance for boarding and exiting the vehicle, preferred routes and destinations, etc.). The data associated with the above attributes are mapped to dynamically establish or change an assigned (by the system) color-coding of the vehicle through physically means mounted on the vehicle and virtually through electronic communications. The number of and frequency of the color changes are also used as inputs. Accordingly, the assigned colors are thereby presented to the passengers, the occupants (drivers and passengers) of nearby vehicles, and pedestrians to inform them of the real time disposition of the operator of the vehicle to facilitate and to take the appropriate level of caution in the vicinity thereof.

In at least some embodiments, the information used to generate the assigned color-coding of the vehicles includes leveraging Internet of Things (IoT) techniques including, but not limited to, vehicle-to-vehicle (V2V) and vehicle-to-infrastructure (V2I) communication techniques. In some embodiments, the logic described herein as derived from the aforementioned context data is used to automatically adjust the distance between adjacent vehicles dynamically while in motion based on the assigned color of the vehicle, the number of vehicles in near proximity or boundary, and the adjacent vehicles' assigned color code (described further herein), the speed limit, and the real time distance between the vehicles. Moreover, in one or more embodiments, the systems described herein are configured to automatically analyze the count, frequency, and depth of potholes on the road in real time and automatically adjust the speed of the vehicle dynamically while in motion. Therefore, the system described herein facilitates providing drivers with sufficient environmental information for proposed routes to successfully navigate or avoid accident-prone areas, inclement weather conditions, poor road conditions, and construction areas through alerts and suggestions to the drivers with respect to best routes and appropriate speeds for the selected routes. Accordingly, the system described herein facilitates proactively preparing the driver and passengers onboard with the expected driving experience, including potential issues that may arise, to provide substantially seamless onboarding, driving, and offboarding experiences.

Furthermore, in at least some embodiments, the systems described herein generate a score card for the operator of the vehicle. In some embodiments, the system is configured to qualify or disqualify a driver for a particular ride if the system identifies that the profiled driver cannot adhere to derived/recommended speeds, or would otherwise likely exceed a potential passenger's parameters for a satisfactory transport experience, at least partially based on the established operator's and passenger's profiles. Also, in some embodiments, the system described herein scores and ranks the prospective operator and vehicle, thereby providing a choice of selection to the passengers. Conversely, in similar embodiments, the system is configured to provide information on prospective passengers to facilitate a choice of passengers to the operators. Accordingly, the system, computer program product, and method described herein facilitate matching operators and passengers for improving the transport experience.

In at least some embodiments, the system, computer program product, and method described herein use an artificial intelligence platform. "Artificial Intelligence" (AI) is one example of cognitive systems that relate to the field of computer science directed at computers and computer behavior as related to humans and man-made and natural systems. Cognitive computing utilizes self-teaching algorithms that use, for example, and without limitation, data analysis, visual recognition, behavioral monitoring, and natural language processing (NLP) to solve problems and optimize human processes. The data analysis and behavioral monitoring features analyze the collected relevant data and behaviors as subject matter data as received from the sources as discussed herein. As the subject matter data is received, organized, and stored, the data analysis and behavioral monitoring features analyze the data and behaviors to determine the relevant details through computational analytical tools which allow the associated systems to learn, analyze, and understand human behavior, including within the context of the present disclosure. With such an understanding, the AI can surface concepts and categories, and apply the acquired knowledge to teach the AI platform the relevant portions of the received data and behaviors. In addition to analyzing human behaviors and data, the AI platform may also be taught to analyze data and behaviors of man-made and natural systems.

In addition, cognitive systems such as AI, based on information, are able to make decisions, which maximizes the chance of success in a given topic. More specifically, AI is able to learn from a dataset, including behavioral data, to solve problems and provide relevant recommendations. For example, in the field of artificial intelligent computer systems, machine learning (ML) systems process large volumes of data, seemingly related or unrelated, where the ML systems may be trained with data derived from a database or corpus of knowledge, as well as recorded behavioral data. The ML systems look for, and determine, patterns, or lack thereof, in the data, "learn" from the patterns in the data, and ultimately accomplish tasks without being given specific instructions. In addition, the ML systems, utilizes algorithms, represented as machine processable models, to learn from the data and create foresights based on this data. More specifically, ML is the application of AI, such as, and without limitation, through creation of neural networks that can demonstrate learning behavior by performing tasks that are not explicitly programmed. Deep learning is a type of neural-network ML in which systems can accomplish complex tasks by using multiple layers of choices based on output of a previous layer, creating increasingly smarter and more abstract conclusions.

ML learning systems may have different "learning styles." One such learning style is supervised learning, where the data is labeled to train the ML system through telling the ML system what the key characteristics of a thing are with respect to its features, and what that thing actually is. If the thing is an object or a condition, the training process is called classification. Supervised learning includes determining a difference between generated predictions of the classification labels and the actual labels, and then minimize that difference. If the thing is a number, the training process is called regression. Accordingly, supervised learning specializes in predicting the future.

A second learning style is unsupervised learning, where commonalities and patterns in the input data are determined by the ML system through little to no assistance by humans. Most unsupervised learning focuses on clustering, i.e., grouping the data by some set of characteristics or features. These may be the same features used in supervised learning, although unsupervised learning typically does not use labeled data. Accordingly, unsupervised learning may be used to find outliers and anomalies in a dataset, and cluster the data into several categories based on the discovered features.

Semi-supervised learning is a hybrid of supervised and unsupervised learning that includes using labeled as well as unlabeled data to perform certain learning tasks. Semi-supervised learning permits harnessing the large amounts of unlabeled data available in many use cases in combination with typically smaller sets of labelled data. Semi-supervised classification methods are particularly relevant to scenarios where labelled data is scarce. In those cases, it may be difficult to construct a reliable classifier through either supervised or unsupervised training. This situation occurs in application domains where labelled data is expensive or difficult obtain, like computer-aided diagnosis, drug discovery and part-of-speech tagging. If sufficient unlabeled data is available and under certain assumptions about the distribution of the data, the unlabeled data can help in the construction of a better classifier through classifying unlabeled data as accurately as possible based on the documents that are already labeled.

The third learning style is reinforcement learning, where positive behavior is "rewarded: and negative behavior is "punished." Reinforcement learning uses an "agent," the agent's environment, a way for the agent to interact with the environment, and a way for the agent to receive feedback with respect to its actions within the environment. An agent may be anything that can perceive its environment through sensors and act upon that environment through actuators. Therefore, reinforcement learning rewards or punishes the ML system agent to teach the ML system how to most appropriately respond to certain stimuli or environments. Accordingly, over time, this behavior reinforcement facilitates determining the optimal behavior for a particular environment or situation.

Deep learning is a method of machine learning that incorporates neural networks in successive layers to learn from data in an iterative manner. Neural networks are models of the way the nervous system operates. Basic units are referred to as neurons, which are typically organized into layers. The neural network works by simulating a large number of interconnected processing devices that resemble abstract versions of neurons. There are typically three parts in a neural network, including an input layer, with units representing input fields, one or more hidden layers, and an output layer, with a unit or units representing target field(s). The units are connected with varying connection strengths or weights. Input data are presented to the first layer, and values are propagated from each neuron to every neuron in the next layer. At a basic level, each layer of the neural network includes one or more operators or functions operatively coupled to output and input. Output from the operator(s) or function(s) of the last hidden layer is referred to herein as activations. Eventually, a result is delivered from the output layers. Deep learning complex neural networks are designed to emulate how the human brain works, so computers can be trained to support poorly defined abstractions and problems. Therefore, deep learning is used to predict an output given a set of inputs, and either supervised learning or unsupervised learning can be used to facilitate such results.

Referring to FIG. 1A, a schematic diagram is provided illustrating a computer system 100, that in the embodiments described herein, is a vehicular information system 100, herein referred to as the system 100. As described further herein, system 100 is configured for automatic collection, generation, and presentation of real time information to vehicular occupants. In at least one embodiment, the system 100 includes one or more automated machine learning (ML) system features to leverage a trained cognitive system to automatically and dynamically provide recommendations and insights to the passengers and operator of a vehicle while travelling therein. In at least one embodiment, the system 300 is embodied as a cognitive system, i.e., an artificial intelligence (AI) platform computing system that includes an artificial intelligence platform 150 suitable for establishing the environment to facilitate the collection, generation, and presentation of real time information to vehicular occupants.

As shown, a server 110 is provided in communication with a plurality of information handling devices 180 (sometimes referred to as information handling systems, computing devices, and computing systems) across a computer network connection 105. The computer network connection 105 may include several information handling devices 180. Types of information handling devices that can utilize the system 100 range from small handheld devices, such as a handheld computer/mobile telephone 180-1 to large mainframe systems, such as a mainframe computer 180-2. Additional examples of information handling devices include personal digital assistants (PDAs), personal entertainment devices, pen or tablet computer 180-3, laptop or notebook computer 180-4, personal computer system 180-5, server 180-6, and one or more Internet of Things (IoT) devices 180-7, that in at least some embodiments, include connected cameras and environmental sensors. As shown, the various information handling devices, collectively referred to as the information handling devices 180, are networked together using the computer network connection 105.

Various types of a computer networks can be used to interconnect the various information handling systems, including Local Area Networks (LANs), Wireless Local Area Networks (WLANs), the Internet, the Public Switched Telephone Network (PSTN), other wireless networks, and any other network topology that can be used to interconnect information handling systems and computing devices as described herein. In at least some embodiments, at least a portion of the network topology includes cloud-based features. Many of the information handling devices 180 include non-volatile data stores, such as hard drives and/or non-volatile memory. Some of the information handling devices 180 may use separate non-volatile data stores, e.g., server 180-6 utilizes non-volatile data store 180-6A, and mainframe computer 180-2 utilizes non-volatile data store 180-2A. The non-volatile data store 180-2A can be a component that is external to the various information handling devices 180 or can be internal to one of the information handling devices 180.

The server 110 is configured with a processing device 112 in communication with memory device 116 across a bus 114. The server 110 is shown with the artificial intelligence (AI) platform 150 for cognitive computing, including machine learning, over the computer network connection 105 from one or more of the information handling devices 180. More specifically, the information handling devices 180 communicate with each other and with other devices or components via one or more wired and/or wireless data communication links, where each communication link may comprise one or more of wires, routers, switches, transmitters, receivers, or the like. In this networked arrangement, the server 110 and the computer network connection 405 enable communication, detection, recognition, and resolution. The server 110 is in operable communication with the computer network through communications links 102 and 104. Links 102 and 104 may be wired or wireless. Other embodiments of the server 110 may be used with components, systems, subsystems, and/or devices other than those that are depicted herein.

The AI platform 150 is shown herein configured with tools to enable automatic collection, generation, and presentation of real time information to vehicular occupants. More specifically, the AI platform 150 is configured for leveraging a trained cognitive system to automatically and dynamically provide recommendations and insights to the passengers and operator of a vehicle while travelling therein. In one embodiment, one or more high-fidelity machine learning (ML) models of the vehicle operators (drivers), the passengers, and the routes is resident within the AI platform 150. Herein, the terms "model" and "models" includes "one or more models." Therefore, as a portion of data ingestion by the model, data resident within a knowledge base 170 is injected into the model as described in more detail herein. Accordingly, the AI platform 150 includes a learning-based mechanism that can facilitate training of the model with respect to the drivers, passengers, and routes to facilitate an effective vehicular information system 100.

Figure 1B:
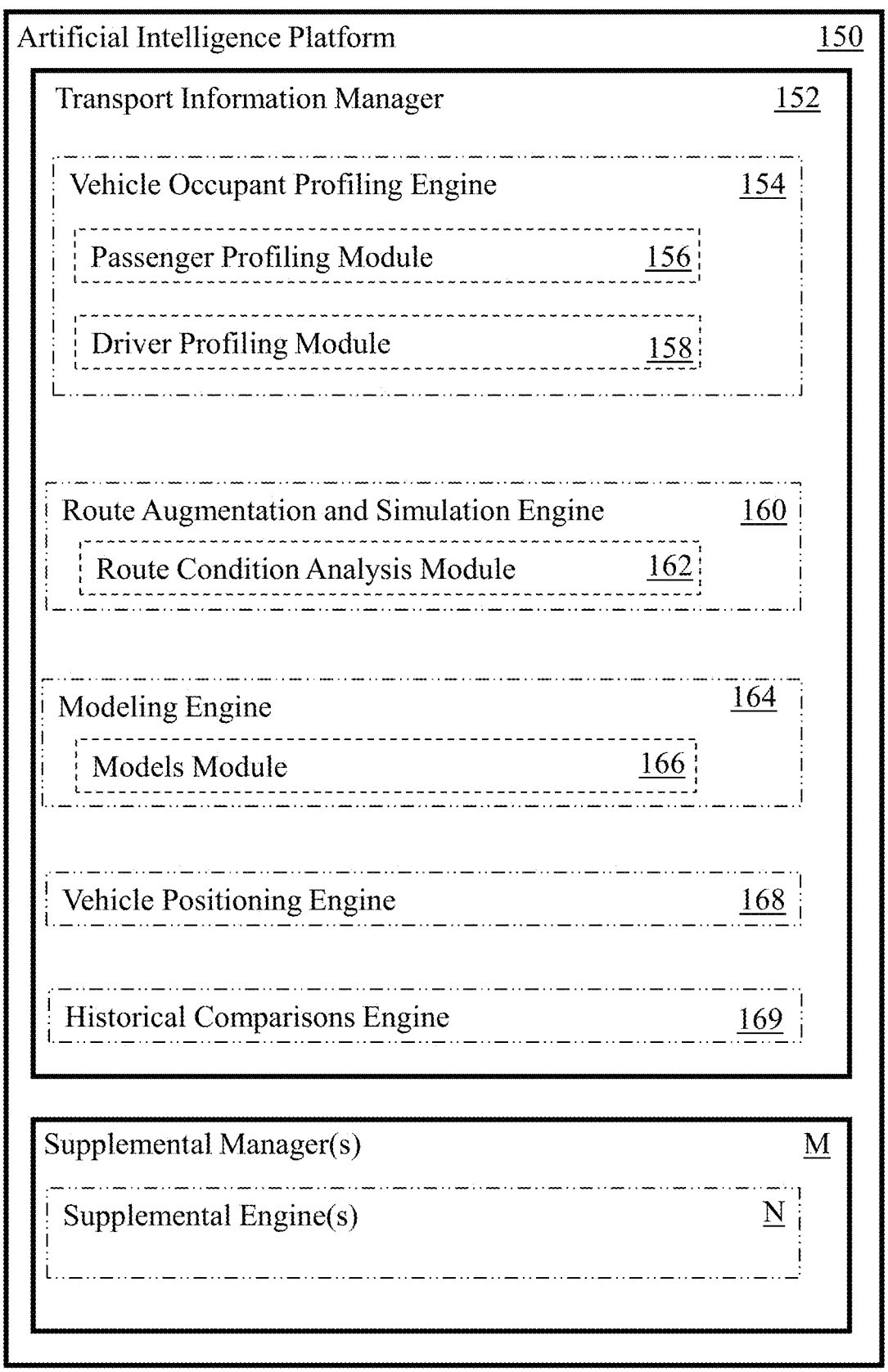
FIG. 1B is a block schematic diagram illustrating the artificial intelligence platform shown in FIG. 1A, in accordance with some embodiments of the present disclosure.

The tools embedded within the AI platform 150 as shown and described herein include, but are not limited to, a transport information manager 152 that is described further with respect to FIG. 1B. Referring to FIG. 1B, a block schematic diagram is provided illustrating the AI platform 150 shown in FIG. 1A with greater detail, in accordance with some embodiments of the present disclosure. Continuing to also refer to FIG. 1A, and continuing the numbering sequence thereof, the transport information manager 152 includes a vehicle occupant profiling engine 154 with a passenger profiling module 156 and a driver profiling module 158 embedded therein. The transport information manager 152 also includes a route augmentation and simulation engine 160 and a route condition analysis sub-module 162. The transport information manager 152 further includes a modeling engine 164 and an embedded models module 166 that includes, without limitation, the models resident therein. The transport information manager 152 also includes a vehicle positioning engine 168 and an historical comparisons engine 169. The transport information manager 152, vehicle occupant profiling engine 154, passenger profiling module 156, driver profiling module 158, route augmentation and simulation engine 160, route condition analysis module 162, modeling engine 164, models module 166, vehicle positioning engine 168, and historical comparisons engine 169 are described further herein with respect to FIGS. 3-4B. In some embodiments, the AI platform 150 includes one or more supplemental managers M (only one shown) and one or more supplemental engines N (only one shown) that are employed for any supplemental functionality in addition to the functionality described herein. The one or more supplemental managers M and the one or more supplemental engines N include any number of modules embedded therein to enable the functionality of the respective managers M and engines N.

Referring again to FIG. 1A, the AI platform 150 may receive input from the computer network connection 105 and leverage the knowledge base 170, also referred to herein as a data source, to selectively access training and other data. The knowledge base 170 is communicatively and operably coupled to the server 110 including the processing device 112 and/or memory 116. In at least one embodiment, the knowledge base 170 may be directly communicatively and operably coupled to the server 110. In some embodiments, the knowledge base 170 is communicatively and operably coupled to the server 110 across the computer network connection 105. In at least one embodiment, the knowledge base 170 includes a data corpus 171 that in some embodiments, is referred to as a data repository, a data library, and knowledge corpus, that may be in the form of one or more databases. The data corpus 171 is described further with respect to FIG. 1C.

Figure 1C:
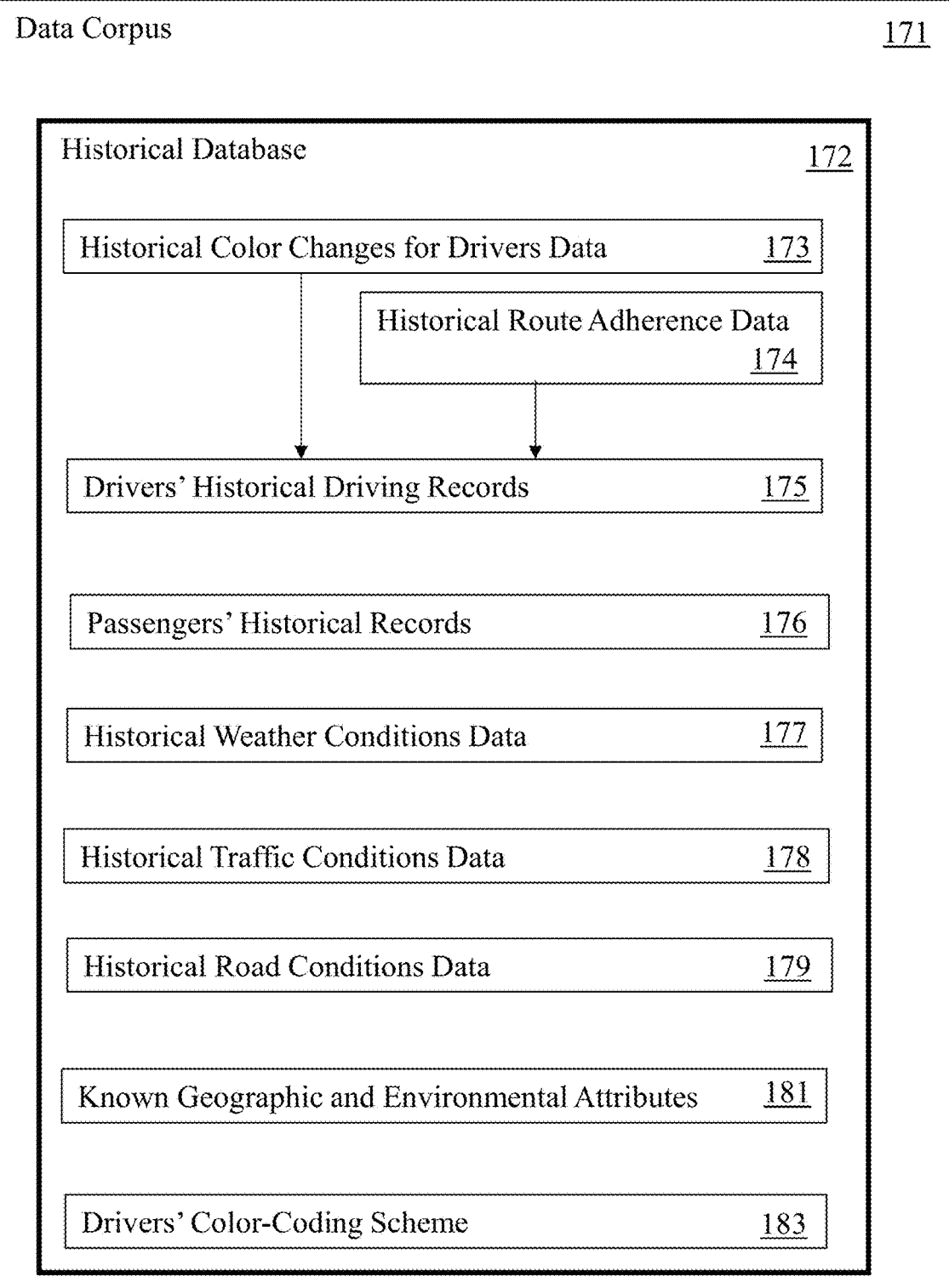
FIG. 1C is a block schematic diagram illustrating a data library shown in FIG. 1A, in accordance with some embodiments of the present disclosure.

Referring to FIG. 1C, a block schematic diagram is presented illustrating the data corpus 171 shown in FIG. 1A with greater detail, in accordance with some embodiments of the present disclosure. Continuing to also refer to FIG. 1A, and continuing the numbering sequence thereof, the data corpus 171 includes different databases, including, but not limited to, a historical database 172 that includes, without limitation, historical color changes for drivers data 173, historical route adherence data 174, drivers' historical driving records 175, passengers' historical records 176, historical weather conditions data 177, historical traffic conditions data 178, historical road conditions data 179, known geographic and environmental attributes 181, and a drivers' color-coding scheme 183. The respective databases and the resident data therein are described further herein with respect to FIGS. 3-4B. Accordingly, the server 110, including the AI platform 150 and the transport information manager 152, receive information through the computer network connection 105 from the devices connected thereto and the knowledge base 170.

Referring again to FIG. 1A, a response output 132 includes, for example, and without limitation, output generated in response to a query of the data corpus 171 that may include some combination of the datasets resident therein. Further details of the information displayed is described with respect to FIGS. 3-4B.

In at least one embodiment, the response output 132 is communicated to a corresponding network device, shown herein as a visual display 130, communicatively and operably coupled to the server 110 or in at least one other embodiment, operatively coupled to one or more of the computing devices across the computer network connection 105.

The computer network connection 105 may include local network connections and remote connections in various embodiments, such that the artificial intelligence platform 150 may operate in environments of any size, including local and global, e.g., the Internet. Additionally, the AI platform 150 serves as a front-end system that can make available a variety of knowledge extracted from or represented in network accessible sources and/or structured data sources. In this manner, some processes populate the AI platform 150, with the AI platform 150 also including one or more input interfaces or portals to receive requests and respond accordingly.

Figure 2:
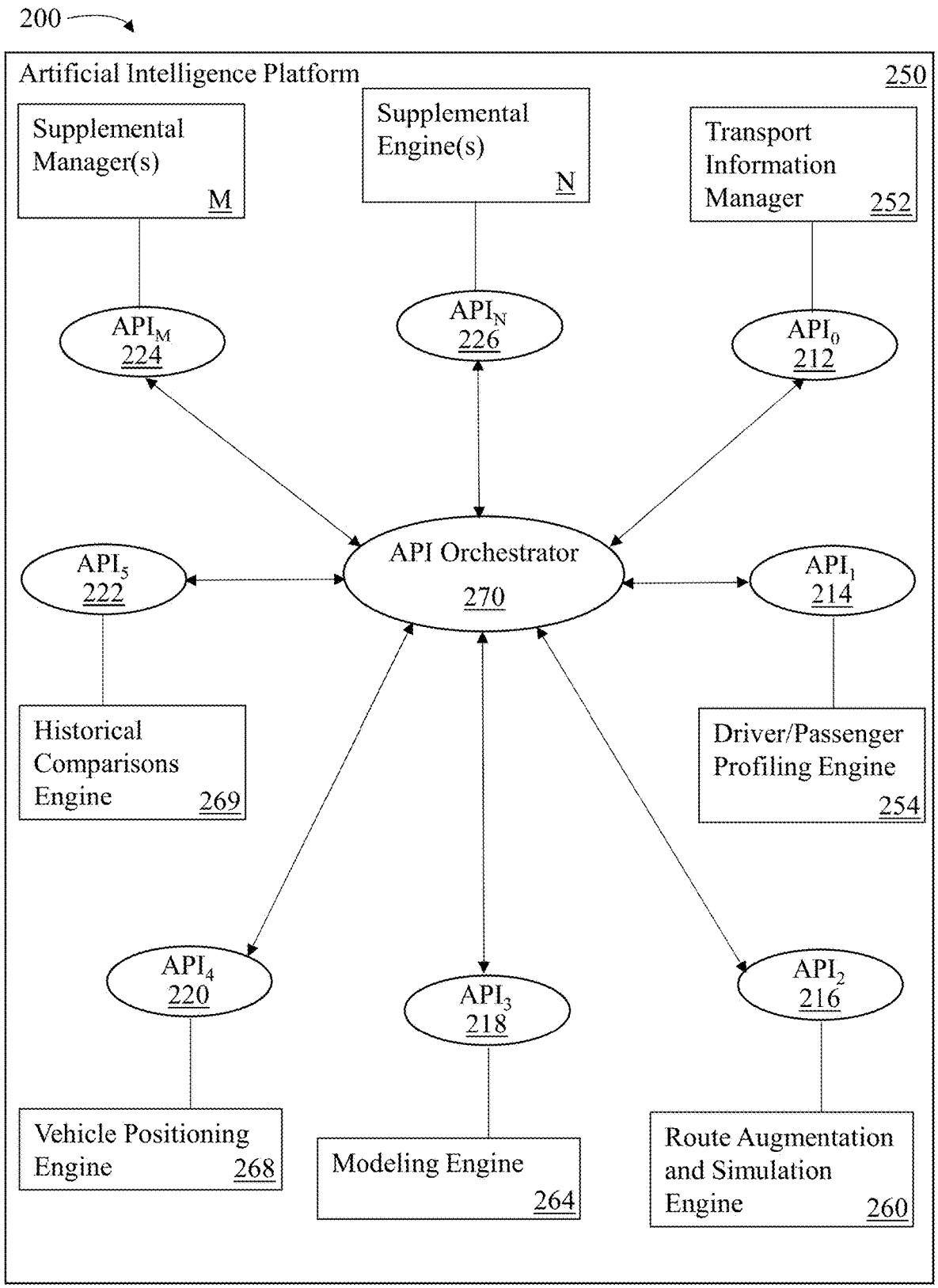
FIG. 2 is a block schematic diagram illustrating one or more artificial intelligence platform tools, as shown and described with respect to FIG. 1, and their associated application program interfaces, in accordance with some embodiments of the present disclosure.

Referring to FIG. 2, a block schematic diagram 200 is provided illustrating one or more artificial intelligence platform tools, as shown and described with respect to FIG. 1, and their associated application program interfaces, in accordance with some embodiments of the present disclosure. An application program interface (API) is understood in the art as a software intermediary, e.g., invocation protocol, between two or more applications which may run on one or more computing environments. As shown, a tool is embedded within the AI platform 250 (shown and described in FIGS. 1A and 1B as the AI platform 150), one or more APIs may be utilized to support one or more of the tools therein, including the transport information manager 252 (shown and described as transport information manager 152 with respect to FIGS. 1A and 1B) and its associated functionality. Accordingly, the AI platform 250 includes the tool including, but not limited to, the transport information manager 252 associated with an $API_0$ 212.

The $API_0$ 212 may be implemented in one or more languages and interface specifications. $API_0$ 212 provides functional support for, without limitation, the transport information manager 252 that is configured to facilitate execution of one or more operations by the server 110 (shown in FIG. 1A). Such operations include, without limitation, collecting, storing, and recalling the data stored within the data corpus 171 as discussed herein, and providing data management and transmission features not provided by any other managers or tools (not shown). Accordingly, the transport information manager 252 is configured to facilitate building, storing, and managing the data in the data corpus 171 including, without limitation, joining of the data resident therein.

In at least some embodiments, the components, i.e., the additional support tools, embedded within the transport information manager 152, including, without limitation, and referring to FIGS. 1A and 1B, the vehicle occupant profiling engine 154 (including the embedded passenger profiling module 156 and the driver profiling module 158), the route augmentation and simulation engine 160 (including the embedded route condition analysis module 162), the modeling engine 164 (including the models module 166), the vehicle positioning engine 168, and the historical comparisons engine 169, and the functionality thereof (as described further herein with respect to FIGS. 3-4B) are also implemented through an API. Specifically, the driver/passenger profiling engine 254 is associated with an $API_1$ 214, the route augmentation and simulation engine 260 is associated with an $API_2$ 216, the modeling engine 264 is associated with an $API_3$ 218, the vehicle positioning engine 268 is associated with an $API_4$ 220, and the historical comparisons engine 269 is associated with an APIs 222. Accordingly, the APIs $API_0$ 212 through APIs 222 provide functional support for the operation of the transport information manager 152 through the respective embedded tools.

In some embodiments, as described for FIG. 1A, the AI platform 150 includes one or more supplemental managers M (only one shown) and one or more supplemental engines N (only one shown) that are employed for any supplemental functionality in addition to the functionality described herein. Accordingly, the one or more supplemental managers M are associated with one or more $APIs_M$ 224 (only one shown) and the one or more supplemental engines N are associated with one or more $APIs_N$ 226 (only one shown) to provide functional support for the operation of the one or more supplemental managers M through the respective embedded tools.

As shown, the APIs $API_0$ 212 though $API_N$ 226 are operatively coupled to an API orchestrator 270, otherwise known as an orchestration layer, which is understood in the art to function as an abstraction layer to transparently thread together the separate APIs. In at least one embodiment, the functionality of the APIs $API_0$ 212 though $API_N$ 226, and any additional APIs, may be joined or combined. As such, the configuration of the APIs $API_0$ 212 through $API_N$ 226 shown herein should not be considered limiting. Accordingly, as shown herein, the functionality of the tools may be embodied or supported by their respective APIs $API_0$ 212 through $API_N$ 226.

Figure 3:
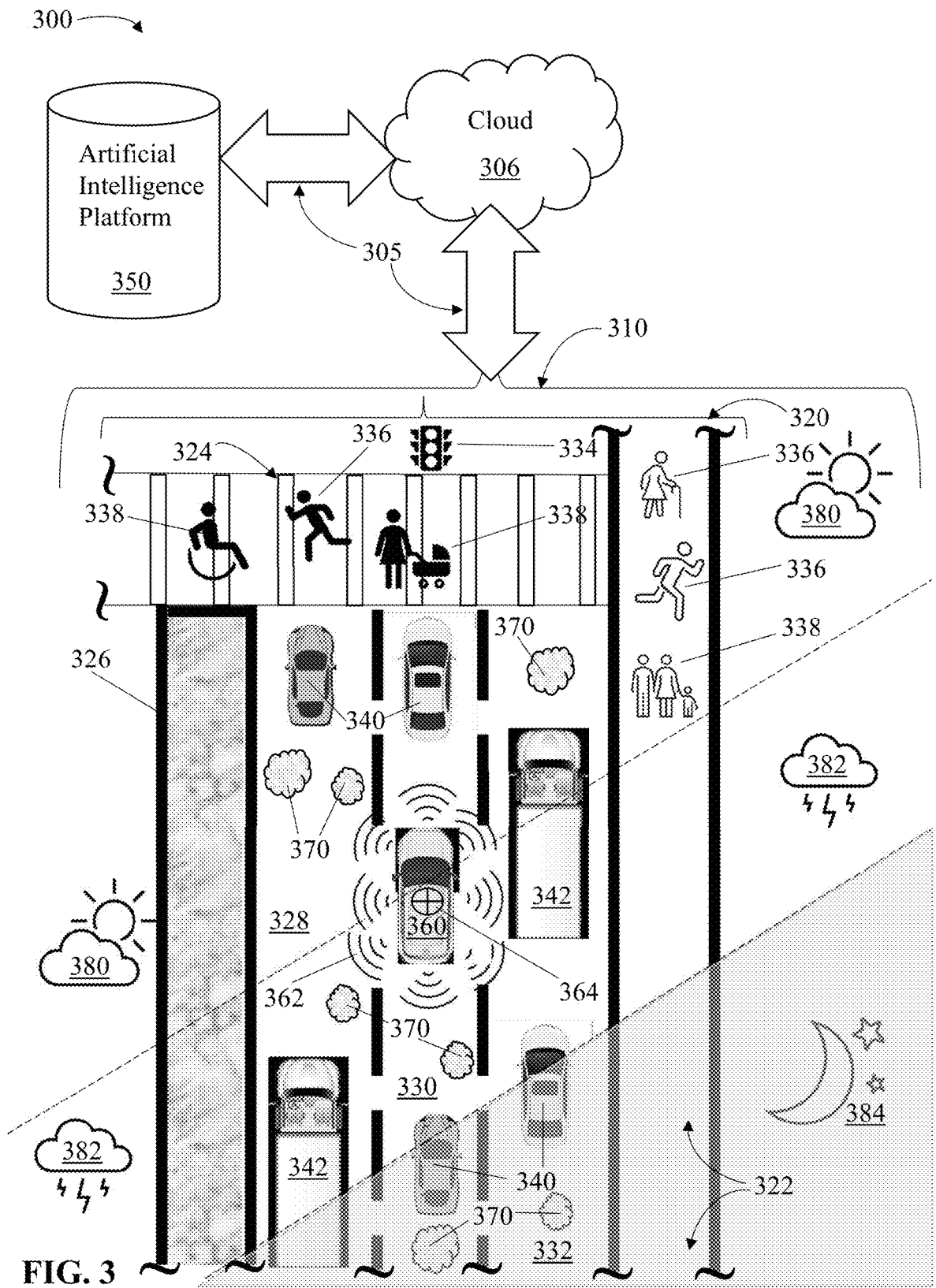
FIG. 3 is a schematic diagram illustrating the system with respect to FIGS. 1A-1C in a plurality of scenarios that an operator of a transport vehicle will typically encounter, in accordance with some embodiments of the present disclosure.

Referring to FIG. 3, a schematic diagram is presented illustrating the system 300 (shown as system 100 with respect to FIGS. 1A-1C) in a plurality of scenarios 310 that an operator of a commercial transport vehicle 360 will typically encounter, in accordance with some embodiments of the present disclosure. In some embodiments, the commercial transport vehicle 360 is a transport service such as a ridesharing service, taxi service (complementary or fee-based), or a bus service and the transport vehicle 360 is any type, make, and model that enables operation of the transport vehicle 360 as described herein.

The AI platform 350 is communicatively and operably coupled to the cloud 306 through the computer network 305 (see computer network 105 in FIG. 1A). The scenarios 310 include a thoroughfare 320. The thoroughfare 320, in some embodiments, is one of a city or suburban street and a city, suburban, rural, interstate, or interprovince highway. In some embodiments, the thoroughfare 320 includes a sidewalk 322, a pedestrian crosswalk 324, a center median 326, three lanes 328, 330, and 332 (where three is non-limiting), and a street light 334. In some embodiments, more or less of the aforementioned elements are contemplated by system 300, such as two lanes, two sidewalks, four lanes, etc. In some embodiments, the scenario also includes pedestrians 336, that further include potential passengers 338. In some embodiments of the system 300, vehicle occupant profiling engine 154 is expanded to a "user profiling engine" that also includes additional users, such as, and without limitation, the pedestrians 336, where a "pedestrian" (or "other user") module is added to the user profiling engine and the potential passengers 338 are integrated into the passenger profiling module 156.

In some embodiments, the scenario 302 includes a plurality of vehicles, e.g., and without limitation, private automobiles 340, automotive trucks 342, and the transport vehicle 360. As shown, the scenario is city traffic. Other traffic scenarios include, without limitation, traffic congestion and relatively light rural highway traffic. In some embodiments, the plurality vehicles include bicycles, motorcycles, scooters, and the like (none shown). The scenario 302 also includes road hazards, such as, and without limitation, potholes 370. In some embodiments, such hazards include construction barriers, vehicular accidents, emergency responders, wet or icy roads, and the like (none shown). At least some embodiments include sunny and clear weather 380, some embodiments include inclement weather 382 (rain, snow, wind, ice, etc.), and some embodiments include night conditions 384 (street lamps, unlighted conditions, roving wild life (deer), etc.). In the embodiment illustrated in FIG. 3, all of the operators, passengers, pedestrians 336, and potential passengers 338 have access to the system 300.

In one or more embodiments, the operators and passengers of the private automobiles 340, the automotive trucks 342, and the transport vehicle 360 are in communication through the system 300 vit IoT techniques, such as, and without limitation, vehicle-to-vehicle (V2V) and vehicle-to-infrastructure (V2I) communication that utilize the IoT devices 180-7 (shown in FIG. 1A). Information that is communicated between the commercial transport vehicle 360 and the other vehicles 340 and 342 includes, without limitation, present speeds and positions with respect to each other, assigned color codes (discussed further herein), anticipated lane changes, expected up-coming stops, and the like. For clarity, only the transport vehicle 360 is shown with IoT transmissions 362; therefore, the IoT signals received by the commercial transport vehicle 360 are not shown. In some embodiments, the commercial transport vehicle 360 is also configured to transmit and receive signals in the radio frequency (RF) band, as well as any other band the enables operation of the system 300 as described herein. The transport vehicle 360 includes a color indicating device 364 to advertise the present disposition of the driver thereof through a color coding scheme, where the color indicating device 364 and the color coding scheme are discussed further herein. The private automobiles 340 and the automotive trucks 342 will also include color indicating devices similar to the color indicating device 364.

The system 300 as described herein is configured to leverage augmented intelligence capabilities to automatically consider the various attributes of the operator of the commercial transport vehicle 360. Such attributes will include, for example, and without limitation, the historical and present dynamic behavior of the operator with respect to automobile operation based on his respective profile. Another such attribute includes historical customer relationships and interactions. Both of the aforementioned attributes are at least partially measured as a function of driving along the most proper route without excessive or extensive unwarranted deviations (from the perspective of the passengers), where the system 300 automatically determines the best routes and times to reach the destination, and reports such to the driver and the passengers. Additional data collected to define the operator attributes include, without limitation, the profiles of the passengers boarded, traffic accidents, infractions, or violations incurred within a specific context, that may be coupled with environmental attributes, such as, without limitation, weather conditions adverse to driving (gloomy, cloudy, rainy, hot, humid etc.) and the road conditions to map the above attributes appropriately and dynamically.

In one or more embodiments, and as described further herein, the operator profile of a particular driver will determine the assigned color of the color indicating device 364 prominently displayed on the commercial transport vehicle 360. In some embodiments, the color indicating device 364 includes one or more devices 364 on the commercial transport vehicle 360 that provide, substantially, 360-degree indication of the assigned color code. Such devices 364 will include, without limitation, one or more of light emitting diode (LED) lamps. In addition, for those devices that provide an icon or other virtual representation of the commercial transport vehicle 360, the assigned color of the vehicle 360 will be changed substantially simultaneously with that of the color indicating device 364. The colors displayed are substantially based on the historical operator profile for historical road conditions, traffic conditions, and weather conditions, the driver's near-term driving performance (e.g., present speed), the present road conditions, and the present weather conditions. When provided with the aforementioned data, the machine learning algorithms and techniques, in conjunction with the artificial intelligence features, of the system 300 either maintains or adjusts the assigned color-coding of the particular operator and transmit the determined color assignment to the operator, the passengers, pedestrians, and proximate vehicles along the route.

In many of the embodiments described herein, at least a portion of the inputs into the system 300 through the devices and mechanisms described with respect to FIG. 1A through the computer network 305, including the cloud 306, includes, without limitation, real time weather conditions, real time traffic conditions, real time road conditions, driver's real time dynamic behavior, occupants' real time dynamic behavior, non-occupants' real time dynamic behavior, other vehicles' real time dynamic behavior, and emergent geographic/environmental data. At least some of the outputs of the system 300 include, without limitation, drivers' color assignments, route specifics, driver qualification/disqualification, drivers' rankings, and vehicle status/alerts.

In some embodiments, the real time weather conditions (including the time of day with respect to the available natural daylight) are captured from one or more localized weather reporting sources, for example, and without limitation, radio stations, weather services, departments of transportation, etc., including those transmitted directly to the system 300 from other drivers in the vicinity of the selected route. Such weather conditions include, without limitation, sunny and clear weather 380, inclement weather 382 (rain, snow, wind, ice, etc.), and night conditions 384 (street lamps, unlighted conditions, roving wild life (deer), etc.). In some embodiments, the real time weather conditions data is processed through the route condition analysis module 162 embedded within the route augmentation and simulation engine 160. Accordingly, real time weather conditions that will affect the behavior of the operator is captured and processed to at least partially define a driver profile and an enhanced route presentation (discussed further herein).

In addition, real time road conditions such as potholes 370, construction delays, vehicular accidents, and wet or icy roads may be captured through the system 300 from one or more localized traffic reporting sources, for example, and without limitation, radio stations, traffic services, departments of transportation, etc., including those transmitted directly to the system 300 from other drivers in the vicinity of the selected route. In some embodiments, the real time road conditions data is processed through the route condition analysis module 162 embedded within the route augmentation and simulation engine 160, where the real time road conditions are at least partially associated with the real time weather conditions. Accordingly, real time road conditions data that will affect the behavior of the operator is captured and processed to at least partially define the driver profile and the enhanced route presentation (discussed further herein).

In addition, real time traffic conditions (city and interstate congestion versus light traffic conditions) may be captured through the system 300 based on the number, proximity (including relative adjacency), and assigned color coding of vehicles 340 and 342, as well as motorcycles, bicycles, and pedestrians, including relative vehicular/pedestrian density. In some embodiments, the real time traffic conditions are captured from one or more localized traffic reporting sources, for example, and without limitation, radio stations, traffic services, departments of transportation, etc., including those transmitted directly to the system 300 from other drivers in the vicinity of the selected route. In some embodiments, the real time traffic conditions data is processed through the route condition analysis module 162 embedded within the route augmentation and simulation engine 160, where the real time traffic conditions are at least partially associated with the real time weather conditions and the real time road conditions. Accordingly, real time traffic conditions data that will affect the behavior of the operator is captured and processed to at least partially define the driver profile and the enhanced route presentation (discussed further herein).

In some embodiments, the driver's real time dynamic behavior is captured directly from the driver and sensors (not shown) emanating the IoT transmissions 362 on the commercial transport vehicle 360, as well as inputs from the passengers in the commercial transport vehicle 360, the nearby vehicles 340 and 342, the pedestrians 336, and the potential passengers 338. For example, a non-exhaustive list of such operator-related data includes vehicle speed statistics (average, maximum, etc.) and the near-term frequency of the assigned color changes on the color indicating device 364. In some embodiments, the driver profile is generated through the driver profiling module 158 embedded in the vehicle occupant profiling engine 154.

In some embodiments, the occupants' (passengers) real time dynamic behavior include direct observations with respect to the operator's driving behavior, and feelings of comfort and safety within the commercial transport vehicle 360. In some embodiments, the non-occupants' real time dynamic behaviors include, without limitation, direct observations with respect to the operator's driving behavior and feelings of safety within the vicinity of the commercial transport vehicle 360. In some embodiments, the passengers' and non-occupants' profiles are generated through the passenger profiling module 156 embedded within the vehicle occupant profiling engine 154. In some embodiments, the occupants, pedestrians 336, and the potential passengers 338 are in communication with the system 300 through one or more of the devices such as, and without limitation, mobile phone 180-1 and tablet 194 (both shown in FIG. 1A).

In some embodiments, the other vehicles' real time dynamic behavior is collected by the system 300 through sensors and IoT devices on the vehicles that are similar to those on the commercial transport vehicle 360, as well as direct reports from the other drivers and other passengers. In some embodiments, is communicated through V2V and V2I communications that utilize the IoT devices 180-7 (shown in FIG. 1A). The real time dynamic behavior data of the other vehicles is processed through the route condition analysis module 162 embedded within the route augmentation and simulation engine 160, where the real time dynamic behavior data of the other vehicles is at least partially associated with the real time road conditions. Accordingly, real time dynamic behavior data of the other vehicles that will affect the behavior of the operator is captured and processed to at least partially define the driver profile and the enhanced route presentation (discussed further herein).

In some embodiments, the real time emergent geographic/environmental data includes, without limitation, emergent road hazards, such as newly reported potholes 370, construction barriers, vehicular accidents, and presence of emergency responders. In some embodiments, the real time emergent geographic/environmental data is processed through the route condition analysis module 162 embedded within the route augmentation and simulation engine 160, where the real time emergent geographic/environmental data are at least partially associated with the real time road conditions. Accordingly, real time emergent geographic/environmental data that will affect the behavior of the operator is captured and processed to at least partially define the driver profile and the enhanced route presentation (discussed further herein).

Accordingly, ns one or more embodiments, the operator's real time behavior is correlated to the totality of the real time conditions to establish the driver's profile in real time with the appropriate context to establish the assigned color indication from the color indicating device 364.

In some embodiments, and also referring to FIG. 1C, the driver's profile is established through one or more of sources of data from the historical database 172 (see FIG. 1C). In some embodiments, such historical data includes historical color changes for drivers data 173 for that particular driver as well as the percentage of time where each of the colors are illuminated on the color indicating device 364. In some embodiments, the driver's historical route adherence data 174 is used to determine if the driver is prone to avoid certain areas due to traffic, weather, or road conditions and take short deviations from an established route, or is prone to divergent routing that extends the transport time of the passengers without reasonable explanation. In some embodiments, the historical color change for drivers data 173 and historical route adherence data 174 are used to establish the drivers' historical driving records 175. In some embodiments, the drivers' historical driving records 175 includes, for example, and without limitation, on-time delivery statistics, lane changing frequencies and circumstances, passenger satisfaction surveys, and the like. In some embodiments, the drivers' historical driving records 175 are used to generate the driver profile through the driver profiling module 158 embedded in the vehicle occupant profiling engine 154. In some embodiments, in addition to evaluating the driver for identical routes the driver has traversed, the system 300 uses similar routes (i.e., routes with similar attributes with respect to weather, traffic, and road conditions) to determine the driver's profile.

In addition, in some embodiments, the historical records 176 of the passengers are used to establish historical patterns of the passengers with respect to the type of trips taken, particular preferences for drivers (aggressive versus non-aggressive drivers, preferred speed limits, air conditioning settings), particular requirements of the passengers (e.g., without limitation, aid required for onboarding/entry to the vehicle and for exiting the vehicle, presence of small children, pregnant passengers, susceptible to motion sickness/nausea), and any other data that facilitates better matching of certain operators with certain passengers to provide a more satisfying experience for both. In some embodiments, the historical records 176 of the passengers are used to generate the vehicle occupant profiles through the passenger profiling module 156 embedded in the vehicle occupant profiling engine 154.

In some embodiments, the historical weather conditions data 177, historical traffic conditions data 178, historical road conditions data 179, and the known geographic and environmental attributes 181 are mapped to the particular driver's behaviors at least temporally and geographically to provide context for the driver's behavior and the respective color selections. In some embodiments, the data associated with the historical weather conditions data 177, historical traffic conditions data 178, historical road conditions data 179, and the known geographic and environmental attributes 181 is processed through the route condition analysis module 162 embedded within the route augmentation and simulation engine 160 to at least partially define the driver profile and the enhanced route presentation. In some embodiments, the historical data is used to train the models resident within the models module 166 through the modeling engine 164 (see FIG. 1B). Accordingly, the historical data facilitates determining the driver's historical profile with the appropriate context and is used to train the integrated model of the routes, the drivers, and the passengers.

In one or more embodiments, the route augmentation and simulation engine 160 is configured to generate augmented visual representations of the route on a windshield display that enhances the actual real world images with virtual objects generated through the engine 160 in conjunction with the trained model resident within the models module 166. The generated virtual objects are created through one or more of simulation, augmented reality, and virtual reality techniques. The inputs to the route augmentation and simulation engine 160 include, without limitation, the real time traffic conditions data, the real time dynamic behavior data of the other vehicles, the real time weather conditions data, and the data associated with the historical weather conditions data 177, historical traffic conditions data 178, historical road conditions data 179, and the known geographic and environmental attributes 181. In some embodiments, at least a portion of the aforementioned data is in video form that can be analyzed and used, at least partially, to create the computer-generated augmentations and simulations. In some embodiments, AI techniques such as, and without limitation, the Markov Decision Process (MDP) and decision tree algorithms. Accordingly, the route augmentation and simulation engine 160 is configured to augment the visual real world portions of the route as the operator of the commercial transport vehicle 360 traverses the established route. Such augmentation includes, without, limitation, pedestrians, other vehicles, and approaching hazards, e.g., potholes 370 that may otherwise not be visible to the operator.

In some embodiments, the drivers' color-coding scheme 183 is stored in the historical database 172. In at least some embodiments, the color coding schemes are each established based on geographic parameters that are at least partially based on the particular (and, in some cases, unique) traffic, weather, and road conditions in that particular geographic area through establishment, e.g., of a geo-fence. The color coding scheme includes assigning colors to an operator of a vehicle subject to particular criteria. For example, an operator of a vehicle that rarely deviates from the predetermined route and drives defensively will obtain a different color coding from an operator of a vehicle that tends to violate posted speed limits and takes route deviations that are at least discomforting to the passengers. One color coding scheme that is used in some embodiments includes "red" to identify the operator as potentially unsafe for the given traffic, weather, and road conditions, therefore some additional distance should be granted between the commercial transport vehicle 360 and adjacent vehicles, and potential passengers may be dissuaded from using that particular driver, especially if such potential passengers have indicated that they prefer less risky travel experiences. The same color coding scheme will also include "yellow" or "amber" to indicate that the operator, for the given conditions, is less risky and that caution should be taken. In addition, the color coding scheme includes "green" to indicate that the operator will most likely meet or exceed the potential passengers' expectations and that proximate drivers should extend the typical level of caution toward the commercial transport vehicle 360. Additional color codes may be used for vehicles in distress, e.g., purple. In other embodiments, any color scheme that enables operation of the system 300 as described herein is used. Accordingly, the vehicular occupants of the system 300 are provided insights into the prospective forthcoming travel and real time insights during the travel along the route.

In at least some embodiments, the system 300 includes a vehicle positioning engine 168 (see FIG. 1B) that is configured to automatically position the commercial transport vehicle 360, including, without limitation, automatically adjusting the distance between adjacent vehicles based on the assigned color code. For example, and without limitation, a rule-of-thumb in the United States for maintaining a distance between vehicles is approximately 10 feet (approximately 3.05 meters) for every 10 miles-per-hour (16.1 kilometers-per-hour). That rule-of-thumb will be suggested for an operator of the commercial transport vehicle 360 that is presently operating with the color indicating device 364 indicating green. For a yellow indication, a reasonable difference may be 10% to 25% greater, and for a red indication, a 50% to 100% greater distance may be suggested. Therefore, under certain circumstances, such as the presently assigned color of the car, the number of vehicles in near proximity, the adjacent vehicles' assigned color codes (also generated by the system 300), the speed limit for the present portion of the route, and the measured distance between the vehicles, the vehicle positioning engine 168 will suggest to the operator to allow the system 300 to adjust the distance between vehicles to the suggested distances and to adjust the speed of the commercial transport vehicle 360. The adjacent vehicles will communicate with each other through the V2V and V2I techniques. In some embodiments, the vehicle positioning engine 168 will notify the operator that it has assumed control, where the operator has the option to resume control through one or more of the vehicle attaining operating values within established parameters or through the operator re-establishing control of the vehicle through a mechanism such as a spoken password. In some embodiments, in addition to controlling the distance between the vehicles in the front and back of the commercial transport vehicle 360, the vehicle positioning engine 168 will also attempt to maintain an appropriate spacing between laterally adjacent vehicles. In some embodiments, the V2V and V2I techniques facilitate the adjacent vehicles cooperating with each other to establish the predetermined distances therebetween and the respective speeds.

In one or more embodiments, the system 300 is configured to determine the extent of a pothole 370 population along the determined route. Specifically, aspects of the pothole 370 population that are determined through the route condition analysis module 162 embedded in the route augmentation and simulation engine 160 of the AI platform 150 include, without limitation, the pothole 370 count, frequency, and depth. Such information is extracted from the traffic and road condition sources previously described herein. In some embodiments, annunciation features of the system 300 (not shown) are used to warn the operator and passengers of the approaching potholes 370. In some embodiments, virtual representations of the potholes 370 are presented to the operator (and the passengers) on an augmented windshield. In some embodiments, the pothole 370 determinations will change the assigned color of the color indicating device 364, for example, from green to yellow, to indicate to other vehicles 340 and 342 that more caution should be exercised with respect to proximity to the commercial transport vehicle 360. In some embodiments, due to the severity of the potholes 370, the color indicating device 364, for example, may shift from green or yellow to red. In some embodiments, the severity of the potholes 370 are substantial enough to warrant exercising the vehicle positioning engine 168 to automatically adjust the speed and inter-vehicular distance as previously discussed. Accordingly, the system 300 is configured to provide the operators and passengers of vehicles prior notification of potential obstacles, e.g., potholes 370 that will be experienced through the route, thereby at least partially setting the passengers' expectations for the ride.

In some embodiments, the system 300 is configured to automatically change the indicated color of the color indicating device 364 from green to yellow when the commercial transport vehicle 360 is entering a school zone where heightened caution is warranted and will be advertised to the proximate other vehicles 340 and 342 and pedestrians 336. The color is shifted from yellow to green once the school zone is exited. In some embodiments, the vehicle positioning engine 168 will automatically adjust the speed of the commercial transport vehicle 360 through the engine speed and brakes thereof as the school zone is approached and exited. In addition, the system 300 is configured to automatically adjust the indicated color of the color indicating device 364 when the environmental conditions about the commercial transport vehicle 360 are changing from one weather pattern to another, where the operators performance is sensitive to the weather, traffic, and road conditions.

In some embodiments, the system 300 is configured to quality and disqualify particular operators for certain rides and routes that are established through the model to change the indicated color as a function of the combination of the weather conditions, traffic conditions, road conditions, the passenger profiles, and the driver profiles established as previously described. For example, and without limitation, the previously described color coding scheme of green-yellow-red will be used to rate and rank the performance of the operators as a function of the respective driver profiles. The color coding scheme is used for an overall rating and ranking of the operators' performance as well as more granular assessments with respect to their performance in the various weather, traffic, and road conditions. For example, a particular potential passenger 348 will prefer a driver with green indications for on-time delivery and yellow for the current weather/traffic/road conditions over another driver that has a yellow indication for on-time delivery and green for the present conditions. Such preferences are individually determined by the respective passengers subject to the individual sensitivities of each passenger and are stored in the passengers' historical records 176. In some embodiments, without limitation, the operators will have numerical rankings assigned through a predetermined ranking process, and each individual potential passenger 338 has an option to designate passenger-defined thresholds for particular aspects of the operators' performance. Accordingly, the system 300 is configured to qualify particular operators for particular potential passengers 338 and to disqualify other operators for the same routes and current weather/traffic/road conditions.

In some embodiments, the system 300 is configured to dynamically provide recommendations throughout the transport of the passengers along the route from the initial selection of the commercial transport vehicle 360 to the safe delivery of the passengers to their destinations. For example, without limitation, emergent construction activity or a festival along the route may be determined by the system 300, such activity being unknown to the operator and passengers, and the system 300 will recommend alternate routes to reduce the impact to the passengers and the operator, where the impacts of the alternate routes are predicted by the system 300. Another example includes the system 300 making dynamic recommendations to the operator of the commercial transport vehicle 360 to adjust the speed to a different band based on the real time weather, traffic, and road conditions based on the predictions of the present traversal of the selected route.

In at least some of the embodiments described herein, the use of sensitive and personal data is minimized whenever possible and established security mechanisms are employed to keep all of the data secure. The collection and use of the passenger data stored in the passengers' historical records 176 is permitted through each individual passenger's consent. Similarly, the use of the drivers' historical driving records 175 is permitted through each individual driver's consent. Also, similarly, the inclusion in the system 300 for collecting real time data is permitted through each passenger's and each driver's consent.

In some embodiments, the models resident within the models module 166 are trained through ingestion of the data in the historical database 172 to facilitate supervised ML learning as previously described herein. The models are configured to predict the combinations of the routes, drivers, and passengers, and to predict the assigned color coding for the attributes of each including the color coding that will be assigned to the selected commercial transport vehicle 360. In some embodiments, the potential passengers will choose the particular commercial transport vehicle 360 as a function of the overall assigned color coding that is predicted to be displayed on the color indicating device 364. In some embodiments, the totality of the data in the historical database 172 will be divided into two groups, i.e., the training data and the testing data, where each group includes the appropriate portions of each of the historical color changes for drivers data 173, historical route adherence data 174, drivers' historical driving records 175, passengers' historical records 176, historical weather conditions data 177, historical traffic conditions data 178, historical road conditions data 179, known geographic and environmental attributes 181, and the drivers' color-coding scheme 183.

In at least some embodiments, once the models are trained and tested, and once the models are placed into production within the system 300, the outputs (i.e., predictions) of the models as they are generated through typical operation of the system 300 as described herein are automatically compared to the appropriate portions of the historical database 172 to determine if additional training of the models is required or to update the models automatically. These comparisons are executed through the historical comparison engine 169 (see FIG. 1B). In addition to the aforementioned quality checks, outliers are determined for further investigation. For example, and without limitation, a passenger rating of a particular operator may be assigned a red color code for operator, where that particular operator as previously obtained only green responses from the passengers and green predicted outputs from the models of the system 300. Such an experience may be established as an outlier and be discounted, at least initially. However, if the frequency of other-than-green results of the comparisons increase, the system 300 will automatically update the models to better align the predictions with the results. In addition, the augmented/simulated route is evaluated and validated from the perspectives of the passengers and the drivers, where the collected feedback data is stored in the respective records databases 175 and 176. Accordingly, the system 300 is configured to automatically update the database as a result of real world results to generate more accurate predictions.

In some embodiments, the models are trained using real time data ingestion, thereby utilizing the previously described feedback features to improve predictions starting at the initial training stage, where the training will be supervised. This training method for the models will decrease the initial training of the system 300 prior to being placed into production, with the increased supervision occurring after being placed into production. In some embodiments, any hybrid combination of pre-production training and post-production training is used that enables operation of the system 300 as described herein.

Figure 4A:
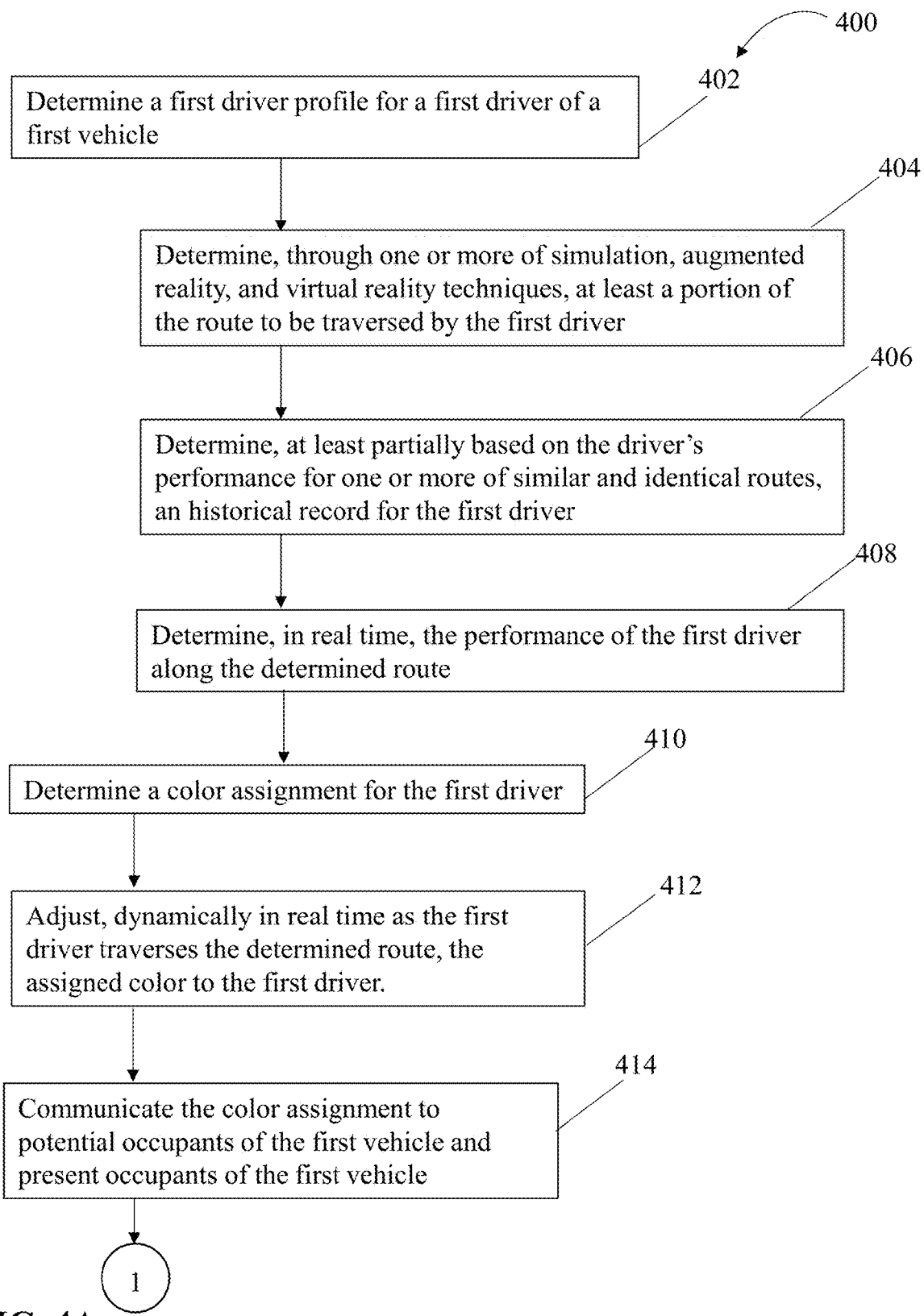
FIG. 4A is a flowchart illustrating a process for automatic collection, generation, and presentation of real time information to vehicular occupants, in accordance with some embodiments of the present disclosure.
Figure 4B:
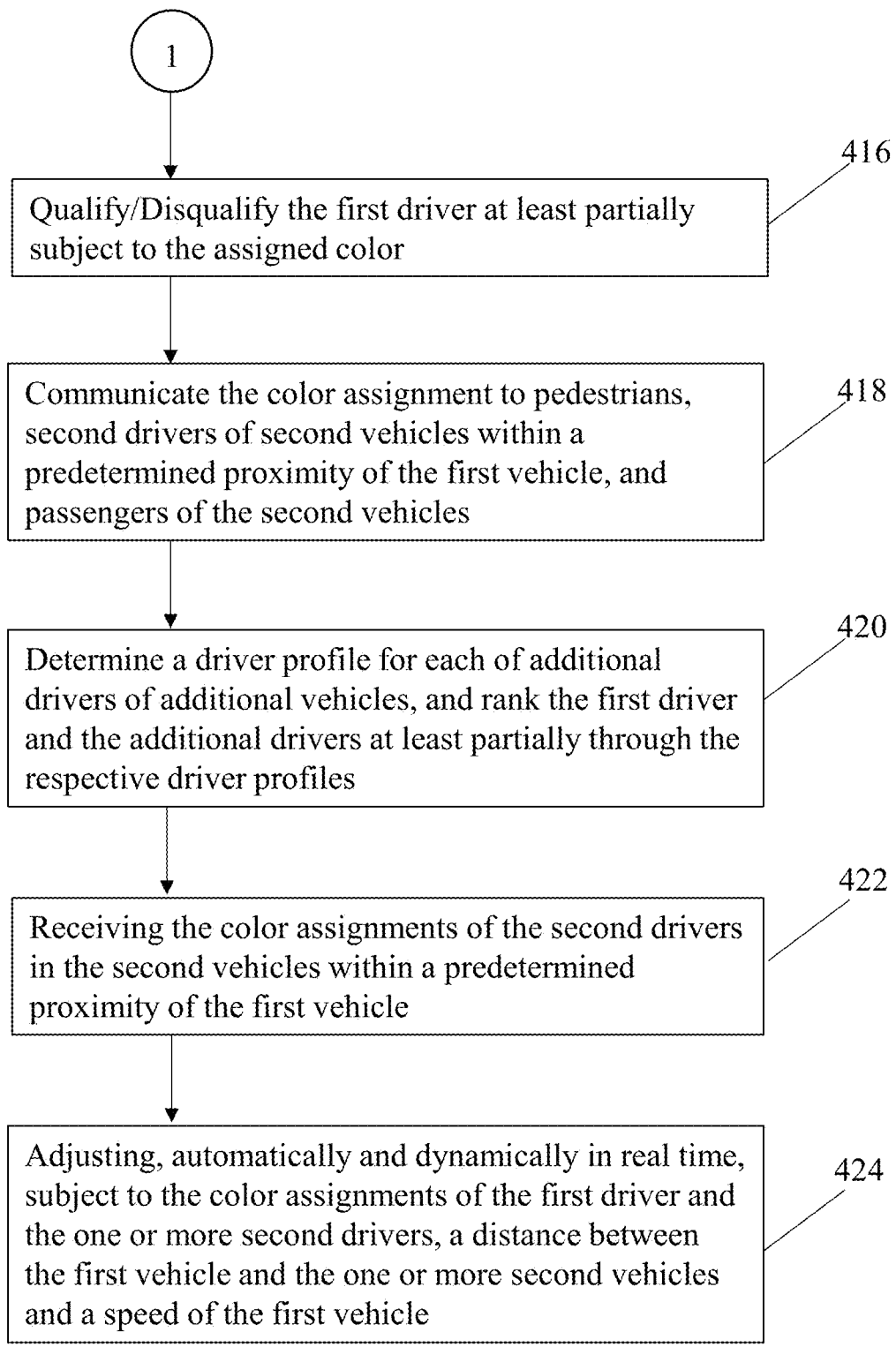
FIG. 4B is a continuation of the flowchart presented in FIG. 4A.

Referring to FIG. 4A, a flowchart of a process 400 for automatic collection, generation, and presentation of real time information to vehicular occupants is presented, in accordance with some embodiments of the present disclosure. FIG. 4B is a continuation of the flowchart presented in FIG. 4A. Referring to FIG. 3 as well, the process 400 is configured to automatically and dynamically provide recommendations and insights to the passengers and operator of a vehicle (e.g., the commercial transport vehicle 360) while travelling therein. In addition, the process 400 is configured to provide recommendations and insights to drivers and passengers of other vehicles and proximate pedestrians, including potential passengers.

In one or more embodiments, the process 400 represents a computer-implemented method that includes determining 402 a first driver profile for a first driver of a first vehicle, i.e., the commercial transport vehicle 360. The determination step 402 includes determining 404, through one or more of simulation, augmented reality, and virtual reality techniques, at least a portion of the route to be traversed by the first driver. The determination step 402 also includes determining 406, at least partially based on the driver's performance for one or more of similar and identical routes, a historical record for the first driver i.e., the drivers' historical driving records 175 (see FIG. 1C). The determination step 402 further includes determining 408, in real time, the performance of the first driver along the determined route.

In at least some embodiments, the process 400 includes determining 410, subject to the first driver profile determination of step 402, a color assignment for the first driver. The color assignment is at least partially indicative of the driver profile, and the color assignment is at least a portion of a representation of the first driver. In addition, the color is prominently displayed on a color indicating device 364 mounted on the commercial transport vehicle 360 to advertise the present disposition of the driver.

The process 400 further includes adjusting 412, dynamically in real time as the first driver traverses the determined route, the assigned color to the first driver. In addition, the process includes communicating 414 the color assignment to potential passengers 338 of the first vehicle (the commercial transport vehicle 360) and one or more present occupants of the first vehicle. For at least some drivers and potential occupants, the process includes qualifying 416 the first driver at least partially subject to the assigned color, and also disqualifying the first driver at least partially subject to the assigned color.

In some embodiments, the process 400 includes communicating 418 the color assignment to one or more of one or more pedestrians 336, one or more second drivers of second vehicles 340 and 342 within a predetermined proximity of the first vehicle, i.e., the commercial transport vehicle 360, and one or more passengers of the second vehicles 340 and 342. Furthermore, in some embodiments, the process 400 includes determining 420 a driver profile for one or more of the second drivers of the second vehicles 340 and 342 and one or more third drivers of the third vehicles 340 and 342, and ranking the first driver, the second drivers, and the third drivers at least partially through the respective driver profiles. The process 400 further includes receiving 422 the color assignments of the one or more second drivers in the second vehicles 340 and 342 with a predetermined proximity of the first vehicle. The process also includes adjusting 424, automatically and dynamically in real time, subject to the color assignments of the first driver and the one or more second drivers, one or more of a distance between the first vehicle and the one or more second vehicles and a speed of the first vehicle.

The system, computer program product, and method as disclosed and described herein are configured for automatic collection, generation, and presentation of real time information to vehicular occupants, and, more specifically, to automatically and dynamically provide recommendations and insights to the passengers and operator of a vehicle while travelling therein. The system, computer program product, and method provide for a complete end-to-end system to provide real-time feedback to the onboard passengers of a vehicle with details of the trip that may otherwise be unavailable to them. The system has augmented intelligence capabilities to consider the various attributes such as known dynamic behaviors of the driver based on the driver's profile. The vehicles operated by the particular driver are assigned a color code based on the driver's historical and present real time performance, and the color coding of the vehicle with the driver is cascaded through multiple communications channels. The driver profile is generated through machine learning techniques including, without limitation, supervised learning of a model through an artificial intelligence platform. In addition, additional vehicles in proximity to the driver's vehicle are also color coded and information sis passed vehicle-to-vehicle through IoT techniques such as V2V and V2I communications.

Moreover, the embodiments described herein are integrated into a practical application through the combination of elements to automatically assign a color code to a plurality of vehicles as a function of the profiles of the respective drivers. The profiles of the drivers are based on the respective drivers' performances with respect to travelling routes subject to the weather, traffic, and road conditions presented to them. The driver profiles and the color coding are used to assist the potential passengers of the respective vehicles an opportunity to select the driver that is most amenable to the particular sensitivities of the potential passengers. In addition, the flow of information with respect to the conditions along the route facilitate improving the drive experience for the passengers through managing their expectations for the drive. For example, the system analyzes the road conditions and provides the driver and passengers with relevant hazard information, e.g., the severity of potholes along the route. In addition, with the adjacent drivers and vehicles also color coded and communicating with each other, unplanned vehicular incidents are avoided through anticipation of each other's reaction to previous conditions. Moreover, particular drivers for certain conditions may be not selected by a potential passenger based on their driving profile. The addition of passenger profiles facilitates improved matchings of drivers and passengers to either qualify or disqualify the operators thereof.

Furthermore, the practical implementation of the elements described herein results in the system configured to automatically adjust the speed of the vehicle and thereby adjusting the distance between vehicles, front and back as well as laterally. Such distancing and speed adjustments are based on the color coding, proximity of the other vehicles, and the local weather, traffic, and road conditions.

Figure 5:
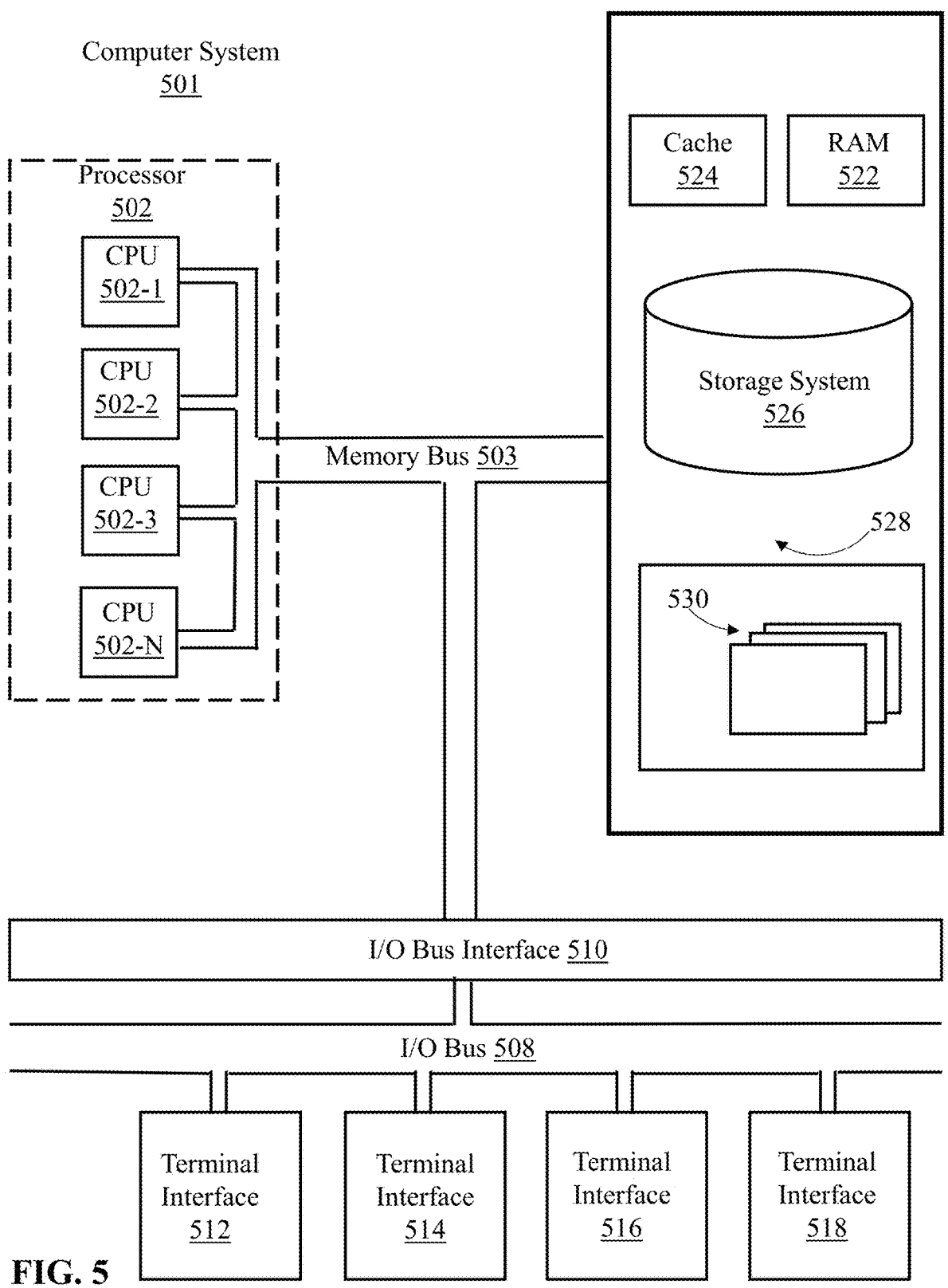
FIG. 5 is a block schematic diagram illustrating a computing system, in accordance with some embodiments of the present disclosure.

Referring now to FIG. 5, a block schematic diagram is provided illustrating a computing system 501 that may be used in implementing one or more of the methods, tools, and modules, and any related functions, described herein (e.g., using one or more processor circuits or computer processors of the computer), in accordance with some embodiments of the present disclosure. In some embodiments, the major components of the computer system 501 may comprise one or more CPUs 502, a memory subsystem 504, a terminal interface 512, a storage interface 516, an I/O (Input/Output) device interface 514, and a network interface 518, all of which may be communicatively coupled, directly or indirectly, for inter-component communication via a memory bus 503, an I/O bus 508, and an I/O bus interface unit 510.

The computer system 501 may contain one or more general-purpose programmable central processing units (CPUs) 502-1, 502-2, 502-3, 502-N, herein collectively referred to as the CPU 502. In some embodiments, the computer system 501 may contain multiple processors typical of a relatively large system; however, in other embodiments the computer system 501 may alternatively be a single CPU system. Each CPU 502 may execute instructions stored in the memory subsystem 504 and may include one or more levels of on-board cache.

System memory 504 may include computer system readable media in the form of volatile memory, such as random access memory (RAM) 522 or cache memory 524. Computer system 501 may further include other removable/non-removable, volatile/non-volatile computer system storage media. By way of example only, storage system 526 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 504 can include flash memory, e.g., a flash memory stick drive or a flash drive. Memory devices can be connected to memory bus 503 by one or more data media interfaces. The memory 504 may include at least one program product having a set (e.g., at least one) of program modules that are configured to carry out the functions of various embodiments.

Although the memory bus 503 is shown in FIG. 5 as a single bus structure providing a direct communication path among the CPUs 502, the memory subsystem 504, and the I/O bus interface 510, the memory bus 503 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 510 and the I/O bus 508 are shown as single respective units, the computer system 501 may, in some embodiments, contain multiple I/O bus interface units 510, multiple I/O buses 508, or both. Further, while multiple I/O interface units are shown, which separate the I/O bus 508 from various communications paths running to the various I/O devices, in other embodiments some or all of the I/O devices may be connected directly to one or more system I/O buses.

In some embodiments, the computer system 501 may be a multi-user mainframe computer system, a single-user system, or a server computer or similar device that has little or no direct user interface, but receives requests from other computer systems (clients). Further, in some embodiments, the computer system 501 may be implemented as a desktop computer, portable computer, laptop or notebook computer, tablet computer, pocket computer, telephone, smart phone, network switches or routers, or any other appropriate type of electronic device.

It is noted that FIG. 5 is intended to depict the representative major components of an exemplary computer system 501. In some embodiments, however, individual components may have greater or lesser complexity than as represented in FIG. 5, components other than or in addition to those shown in FIG. 5 may be present, and the number, type, and configuration of such components may vary.

One or more programs/utilities 528, each having at least one set of program modules 530 may be stored in memory 504. The programs/utilities 528 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Programs 528 and/or program modules 530 generally perform the functions or methodologies of various embodiments.

It is to be understood that although this disclosure includes a detailed description on cloud computing, implementation of the teachings recited herein is not limited to a cloud computing environment. Rather, embodiments of the present disclosure are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows.

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows.

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

A cloud computing environment is service oriented with a focus on statelessness, low coupling, modularity, and semantic interoperability. At the heart of cloud computing is an infrastructure that includes a network of interconnected nodes. The system 501 may be employed in a cloud computing environment.

Figure 6:
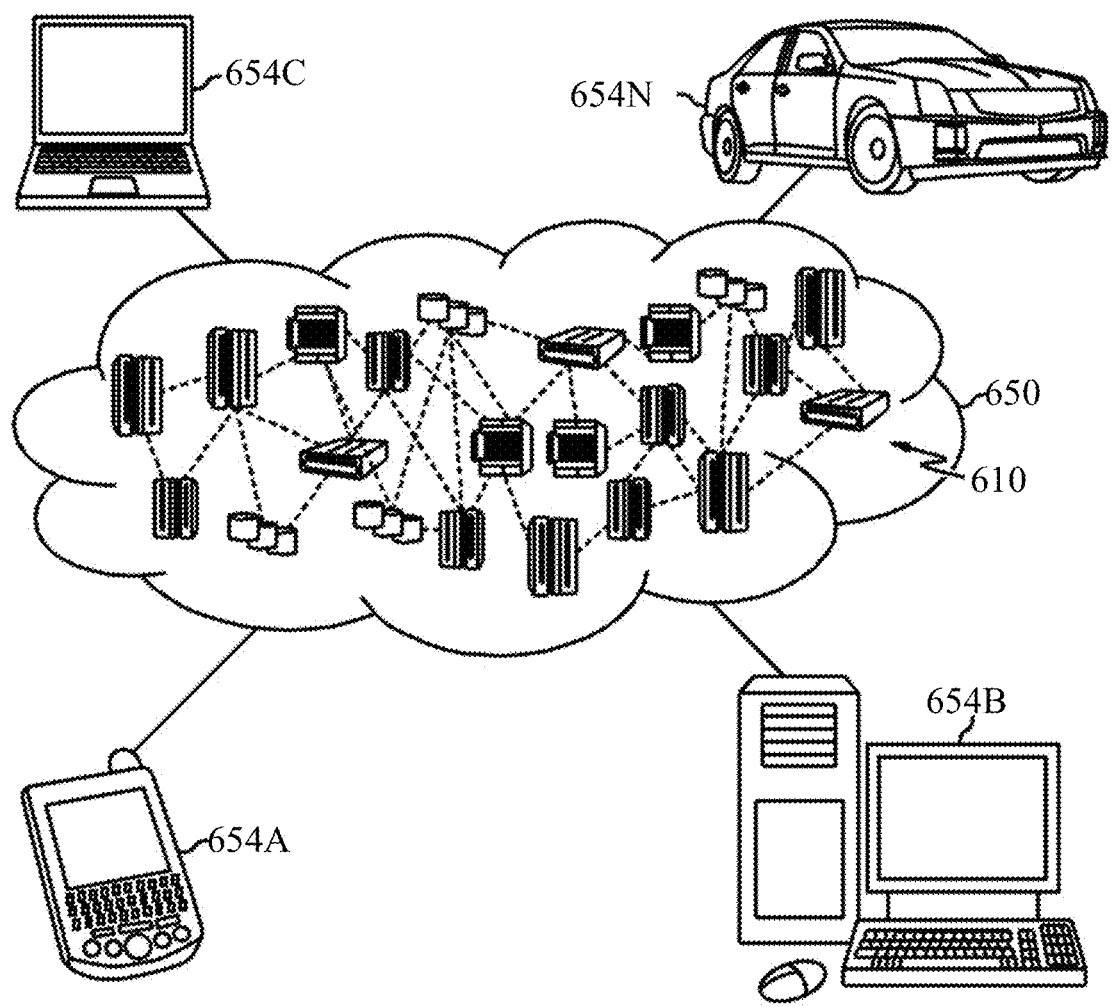
FIG. 6 is a block schematic diagram illustrating a cloud computing environment, in accordance with some embodiments of the present disclosure.

Referring to FIG. 6, a schematic diagram is provided illustrating a cloud computing environment 650, in accordance with some embodiments of the present disclosure. As shown, cloud computing environment 650 comprises one or more cloud computing nodes 610 with which local computing devices used by cloud consumers, such as, for example, personal digital assistant (PDA) or cellular telephone 654A, desktop computer 654B, laptop computer 654C, and/or automobile computer system 654N may communicate. Nodes 610 may communicate with one another. They may be grouped (not shown) physically or virtually, in one or more networks, such as Private, Community, Public, or Hybrid clouds as described hereinabove, or a combination thereof. This allows cloud computing environment 650 to offer infrastructure, platforms and/or software as services for which a cloud consumer does not need to maintain resources on a local computing device. It is understood that the types of computing devices 654A-N shown in FIG. 6 are intended to be illustrative only and that computing nodes 610 and cloud computing environment 650 may communicate with any type of computerized device over any type of network and/or network addressable connection (e.g., using a web browser).

Figure 7:
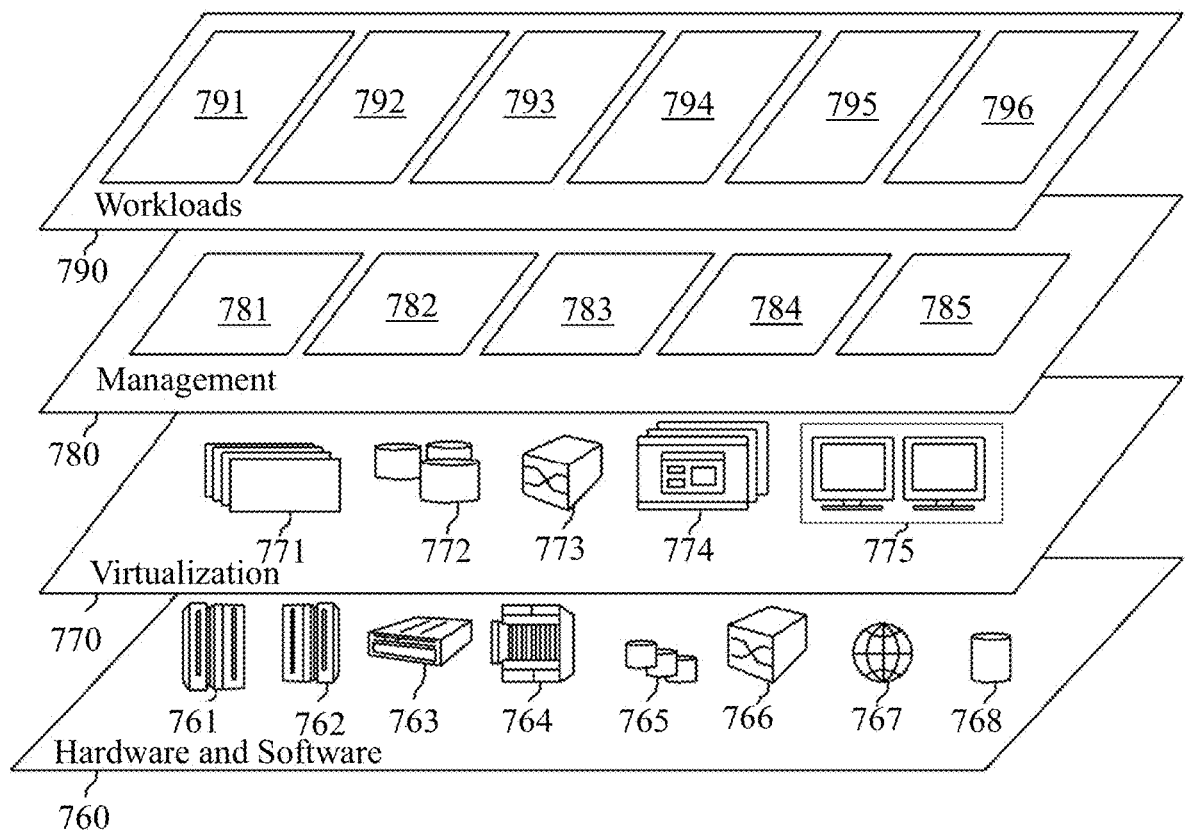
FIG. 7 is a block schematic diagram illustrating a set of functional abstraction model layers provided by the cloud computing environment, in accordance with some embodiments of the present disclosure.

Referring to FIG. 7, a schematic diagram is provided illustrating a set of functional abstraction model layers provided by the cloud computing environment 750 (FIG. 7), in accordance with some embodiments of the present disclosure. It should be understood in advance that the components, layers, and functions shown in FIG. 7 are intended to be illustrative only and embodiments of the disclosure are not limited thereto. As depicted, the following layers and corresponding functions are provided:

Hardware and software layer 760 includes hardware and software components. Examples of hardware components include: mainframes 761; RISC (Reduced Instruction Set Computer) architecture based servers 762; servers 763; blade servers 764; storage devices 765; and networks and networking components 766. In some embodiments, software components include network application server software 767 and database software 768.

Virtualization layer 770 provides an abstraction layer from which the following examples of virtual entities may be provided: virtual servers 771; virtual storage 772; virtual networks 773, including virtual private networks; virtual applications and operating systems 774; and virtual clients 775.

In one example, management layer 780 may provide the functions described below. Resource provisioning 781 provides dynamic procurement of computing resources and other resources that are utilized to perform tasks within the cloud computing environment. Metering and Pricing 782 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 783 provides access to the cloud computing environment for consumers and system administrators. Service level management 784 provides cloud computing resource allocation and management such that required service levels are met. Service Level Agreement (SLA) planning and fulfillment 785 provide pre-arrangement for, and procurement of, cloud computing resources for which a future requirement is anticipated in accordance with an SLA.

Workloads layer 790 provides examples of functionality for which the cloud computing environment may be utilized. Examples of workloads and functions which may be provided from this layer include: mapping and navigation 791; software development and lifecycle management 792; layout detection 793; data analytics processing 794; transaction processing 795; and to automatic collection, generation, and presentation of real time information to vehicular occupants 796.

The present disclosure may be a system, a method, and/or a computer program product at any possible technical detail level of integration. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer system for automatic collection, generation, and presentation of real time information to vehicular occupants comprising:
    one or more processing devices;
    one or more memory devices communicatively and operably coupled to the one or more processing devices;
    a transport information tool communicatively and operably coupled to the one or more processing devices and the one or more memory devices comprising:
        a vehicle occupant profiling engine configured to determine a first driver profile for a first driver of a first vehicle; and
        a modeling engine configured to determine, subject to the first driver profile determination, a color assignment for the first driver according to a color coding scheme, wherein the color assignment is at least partially indicative of the driver profile and real time conditions, the color assignment is at least a portion of a representation of the first driver and the color coding scheme is at least partially established based on geographic parameters; and
        a computer network configured to communicate the color assignment to one or more of:
            one or more potential occupants of the first vehicle; and
            one or more occupants of the first vehicle.

2. The system of claim 1, wherein:
    the system further comprises a route augmentation and simulation engine configured to determine, through one or more of simulation, augmented reality, and virtual reality techniques, at least a portion of a route to be traversed by the first driver;
    the vehicle occupant profiling engine is further configured to:
        determine, at least partially based on a performance of the first driver for one or more of similar and identical routes, a historical record for the first driver; and
        determine, in real time, the performance of the first driver along the determined route.

3. The system of claim 1, wherein the computer network is further configured to:
communicate the color assignment to one or more of:
one or more pedestrians;
one or more second drivers of second vehicles within a predetermined proximity of the first vehicle; and
one or more passengers of the second vehicles.

4. The system of claim 1, wherein the computer network is further configured to:
receive color assignments of one or more second drivers in second vehicles with a predetermined proximity of the first vehicle.

5. The system of claim 4, further comprising a vehicle positioning engine configured to:
adjust, automatically and dynamically in real time, subject to the color assignments of the first driver and the one or more second drivers, one or more of:
a distance between the first vehicle and the one or more second vehicles; and
a speed of the first vehicle.

6. The system of claim 1, wherein the modeling engine is further configured to:
adjust, dynamically in real time as the first driver traverses the determined route, the assigned color to the first driver.

7. The system of claim 1, wherein the modeling engine is further configured to:
qualify the first driver at least partially subject to the assigned color; and
disqualify the first driver at least partially subject to the assigned color.

8. The system of claim 1, wherein the vehicle occupant profiling engine is further configured to:
determine a driver profile for one or more third drivers of third vehicles; and
rank the first driver and the one or more third drivers at least partially through the respective driver profiles.

9. A computer program product embodied on at least one non-transitory computer readable storage medium having computer executable instructions for automatic collection, generation, and presentation of real time information to vehicular occupants that when executed cause one or more computing devices to:
determine a first driver profile for a first driver of a first vehicle;
determine, subject to the first driver profile determination, a color assignment for the first driver according to a color coding scheme, wherein the color assignment is at least partially indicative of the driver profile and real time conditions, the color assignment is at least a portion of a representation of the first driver and the color coding scheme is at least partially established based on geographic parameters; and
communicate the color assignment to one or more of:
one or more potential occupants of the first vehicle; and
one or more occupants of the first vehicle.

10. The computer program product of claim 9, further having computer executable instructions to:
determine, through one or more of simulation, augmented reality, and virtual reality techniques, at least a portion of a route to be traversed by the first driver;
determine, at least partially based on based on a performance of the first driver for one or more of similar and identical routes, a historical record for the first driver; and
determine, in real time, the performance of the first driver along the determined route.

11. The computer program product of claim 9, further having computer executable instructions to:
receive color assignments of one or more second drivers in second vehicles with a predetermined proximity of the first vehicle; and
adjust, automatically and dynamically in real time, subject to the color assignments of the first driver and the one or more second drivers, one or more of:
a distance between the first vehicle and the one or more second vehicles; and
a speed of the first vehicle.

12. The computer program product of claim 9, further having computer executable instructions to:
adjust, dynamically in real time as the first driver traverses the determined route, the assigned color to the first driver;
qualify the first driver at least partially subject to the assigned color;
disqualify the first driver at least partially subject to the assigned color;
determine a driver profile for one or more third drivers of third vehicles; and
rank the first driver and the one or more third drivers at least partially through the respective driver profiles.

13. A computer-implemented method for automatic collection, generation, and presentation of real time information to vehicular occupants comprising:
determining a first driver profile for a first driver of a first vehicle;
determining, subject to the first driver profile determination, a color assignment for the first driver according to a color coding scheme, wherein the color assignment is at least partially indicative of the driver profile and real time conditions, the color assignment is at least a portion of a representation of the first driver and the color coding scheme is at least partially established based on geographic parameters; and
communicating the color assignment to one or more of:
one or more potential occupants of the first vehicle; and
one or more occupants of the first vehicle.

14. The method of claim 13, wherein the determining the first driver profile comprises:
determining, through one or more of simulation, augmented reality, and virtual reality techniques, at least a portion of a route to be traversed by the first driver;
determining, at least partially based on based on a performance of the first driver for one or more of similar and identical routes, a historical record for the first driver; and
determining, in real time, the performance of the first driver along the determined route.

15. The method of claim 13, further comprising:
communicating the color assignment to one or more of:
one or more pedestrians;
one or more second drivers of second vehicles within a predetermined proximity of the first vehicle; and
one or more passengers of the second vehicles.

16. The method of claim 13, further comprising:
receiving color assignments of one or more second drivers in second vehicles with a predetermined proximity of the first vehicle.

17. The method of claim 16, further comprising:
adjusting, automatically and dynamically in real time, subject to the color assignments of the first driver and the one or more second drivers, one or more of:
a distance between the first vehicle and the one or more second vehicles; and a speed of the first vehicle.

18. The method of claim 13, further comprising:
adjusting, dynamically in real time as the first driver traverses the determined route, the assigned color to the first driver.

19. The method of claim 13, further comprising one of:
qualifying the first driver at least partially subject to the assigned color; and
disqualifying the first driver at least partially subject to the assigned color.

20. The method of claim 13, further comprising:
determining a driver profile for one or more third drivers of third vehicles; and
ranking the first driver and the one or more third drivers at least partially through the respective driver profiles.

* * * * *